United States Patent
Noro et al.

(10) Patent No.: US 11,164,639 B2
(45) Date of Patent: Nov. 2, 2021

(54) SEMICONDUCTOR MEMORY DEVICE

(71) Applicant: TOSHIBA MEMORY CORPORATION, Tokyo (JP)

(72) Inventors: Hiromi Noro, Kanagawa (JP); Yusuke Ochi, Kanagawa (JP); Takahiro Sugimoto, Kanagawa (JP); Naoaki Kanagawa, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 147 days.

(21) Appl. No.: 16/561,094

(22) Filed: Sep. 5, 2019

(65) Prior Publication Data

US 2020/0202954 A1 Jun. 25, 2020

(30) Foreign Application Priority Data

Dec. 21, 2018 (JP) .............................. JP2018-240048

(51) Int. Cl.
| | | |
|---|---|---|
| *G11C 5/06* | (2006.01) | |
| *G11C 16/26* | (2006.01) | |
| *G11C 16/04* | (2006.01) | |
| *G11C 16/08* | (2006.01) | |
| *G11C 16/14* | (2006.01) | |
| *G11C 16/32* | (2006.01) | |
| *G11C 16/10* | (2006.01) | |
| *H01L 27/11582* | (2017.01) | |
| *H01L 27/11556* | (2017.01) | |

(52) U.S. Cl.
CPC .............. *G11C 16/26* (2013.01); *G11C 5/063* (2013.01); *G11C 16/0483* (2013.01); *G11C 16/08* (2013.01); *G11C 16/10* (2013.01); *G11C 16/14* (2013.01); *G11C 16/32* (2013.01); *H01L 27/11556* (2013.01); *H01L 27/11582* (2013.01)

(58) Field of Classification Search
CPC ..... G11C 16/26; G11C 16/0483; G11C 16/08; G11C 16/14; G11C 16/32; G11C 16/10; G11C 11/5642; G11C 11/5628; G11C 16/24; H01L 27/11582; H01L 27/11556
See application file for complete search history.

(56) References Cited

U.S. PATENT DOCUMENTS

| | | | | |
|---|---|---|---|---|
| 5,805,524 A | * | 9/1998 | Kotani ................. | G11C 11/406 365/238 |
| 5,870,343 A | * | 2/1999 | Chi ........................ | G11C 7/06 365/203 |
| 6,449,759 B1 | | 9/2002 | Whitney et al. | |
| 6,765,413 B2 | | 7/2004 | Nakase | |
| 7,423,914 B2 | | 9/2008 | Kwack et al. | |
| (Continued) | | | | |

FOREIGN PATENT DOCUMENTS

| | | |
|---|---|---|
| JP | 2002373039 A | 12/2002 |
| JP | 2003058594 A | 2/2003 |
| (Continued) | | |

*Primary Examiner* — Jay W. Radke
(74) *Attorney, Agent, or Firm* — Holtz, Holtz & Volek PC

(57) ABSTRACT

According to one embodiment, a semiconductor memory device includes: a memory cell array; a conversion circuit; a data bus; a first buffer and a second buffer; and a third buffer. The data bus includes a first wiring part extending along a first direction. The first buffer and the second buffer are separate from each other. The first to third buffers are at different positions along the first direction.

9 Claims, 18 Drawing Sheets

(56) References Cited

U.S. PATENT DOCUMENTS

| | | |
|---|---|---|
| 9,287,265 B2 | 3/2016 | Park et al. |
| 9,600,620 B2 | 3/2017 | Ahluwalia et al. |
| 2004/0047404 A1* | 3/2004 | Kim .................... G11C 7/1096 375/211 |
| 2004/0125826 A1* | 7/2004 | Tschanz ................ H04L 25/242 370/545 |
| 2005/0270067 A1* | 12/2005 | Masleid ................ H04L 25/242 326/121 |
| 2012/0319741 A1* | 12/2012 | Bosshart ............. H01L 23/5222 327/109 |

FOREIGN PATENT DOCUMENTS

| | | |
|---|---|---|
| JP | 2005012045 A | 1/2005 |
| JP | 2007020135 A | 1/2007 |
| JP | 2008103570 A | 5/2008 |
| JP | 2010186304 A | 8/2010 |
| JP | 2015050462 A | 3/2015 |

* cited by examiner

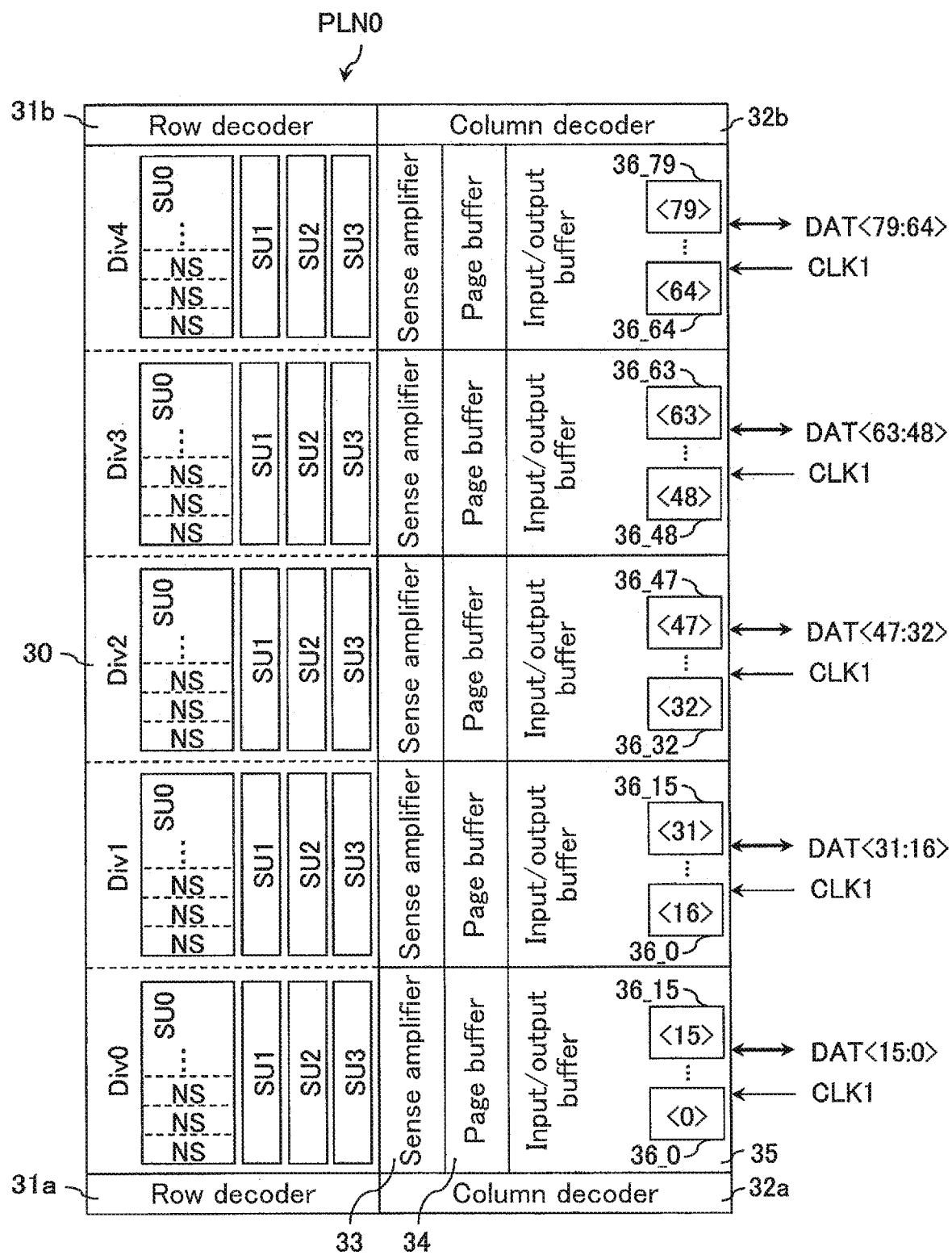
F I G. 2

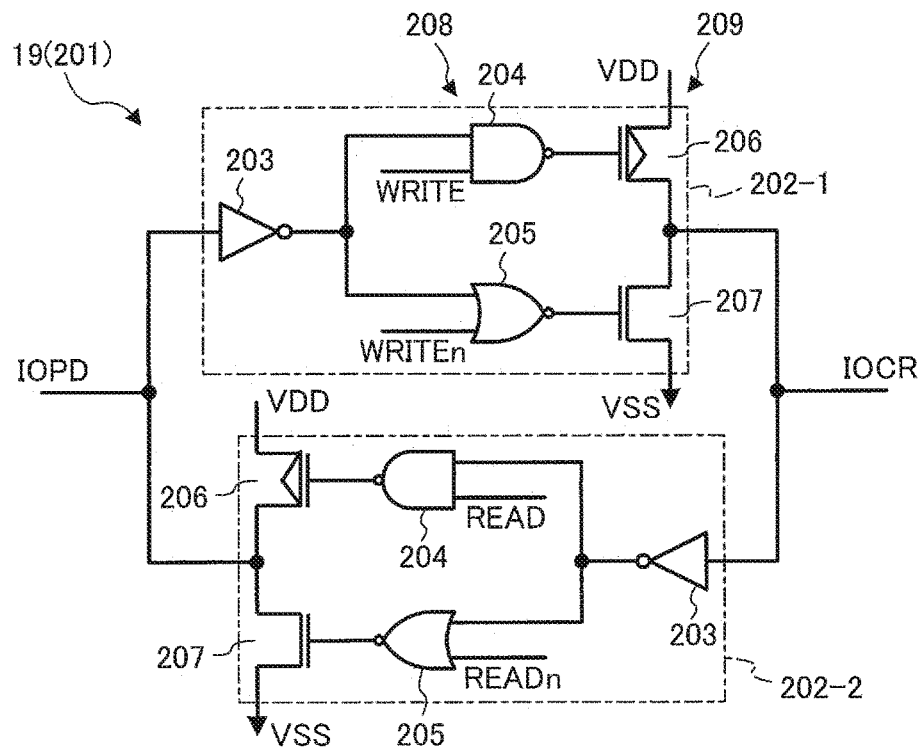
F I G. 6
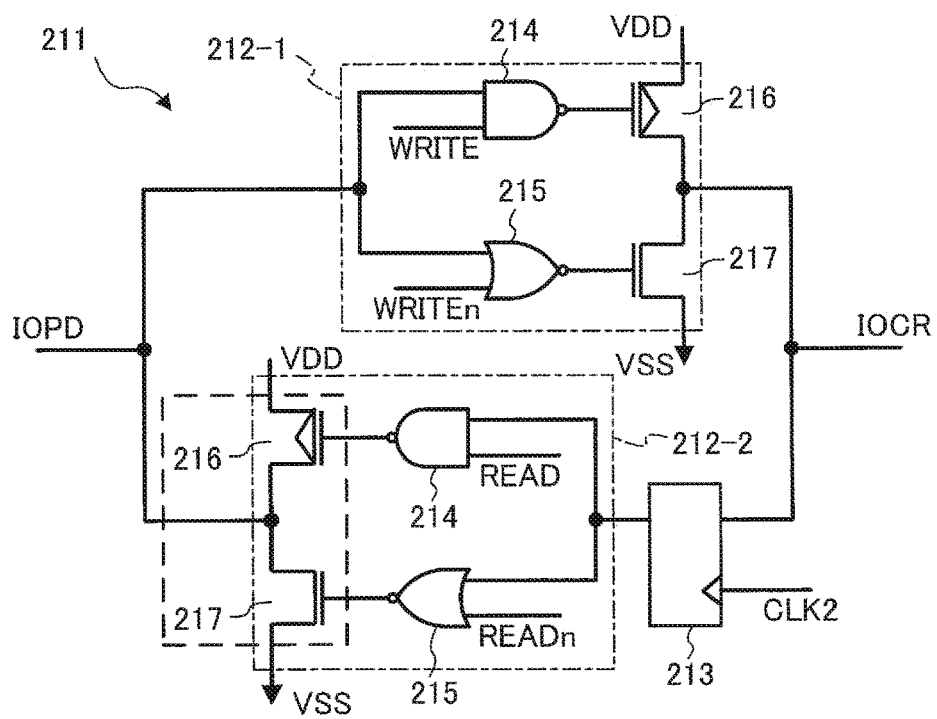
F I G. 7

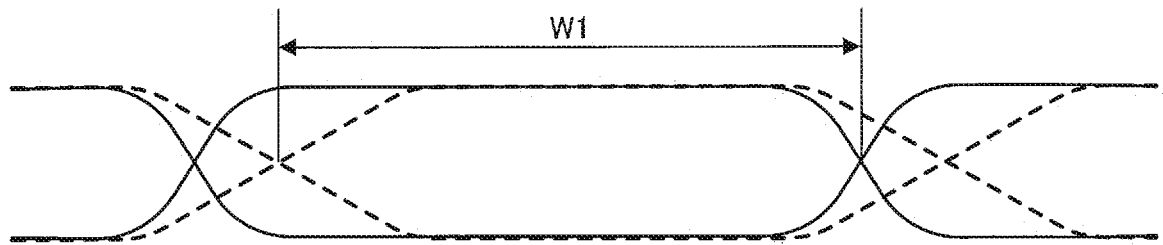
F I G. 12A
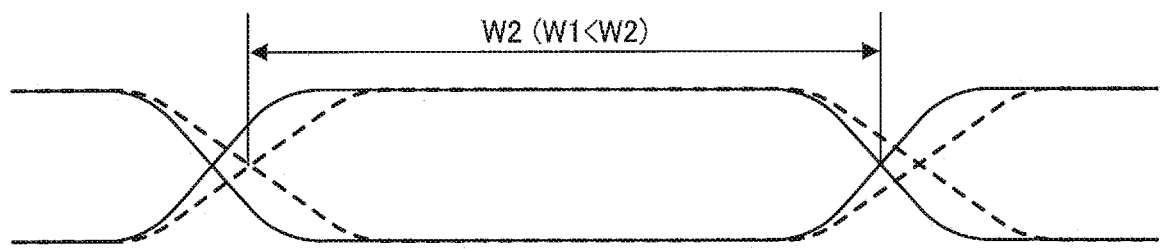
F I G. 12B
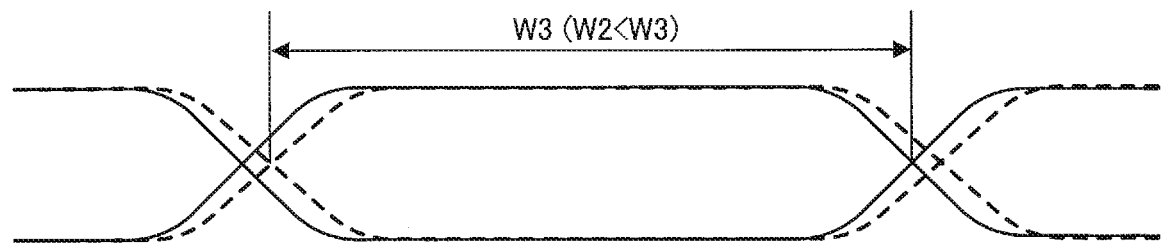
F I G. 12C

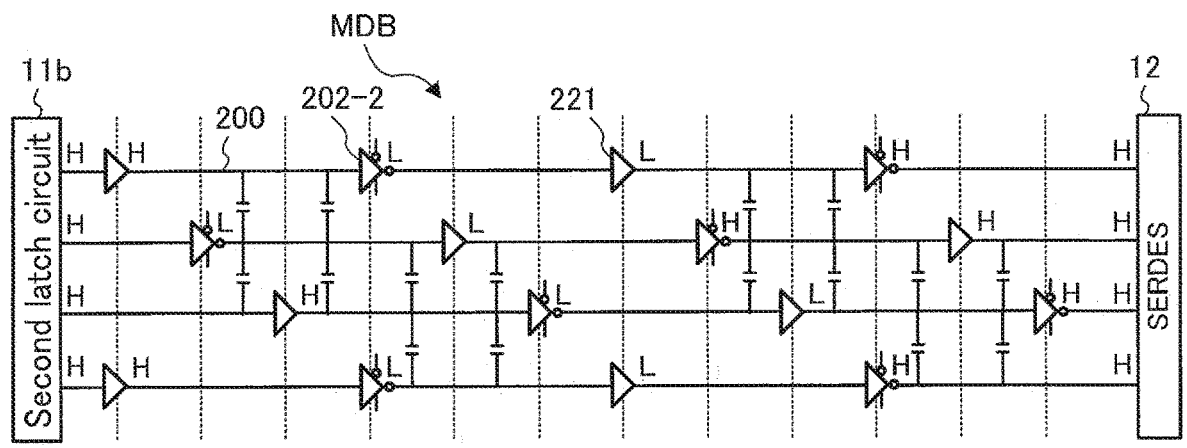
F I G. 15A
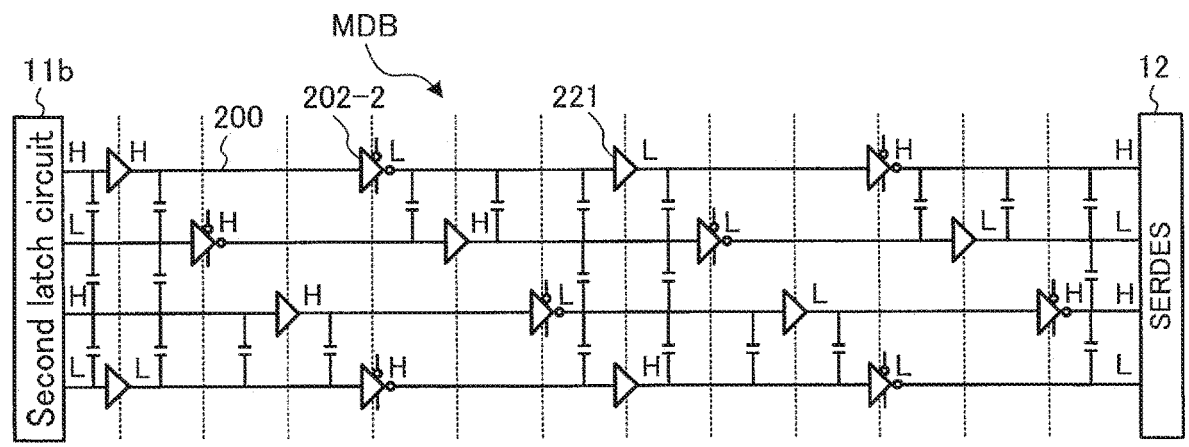
F I G. 15B

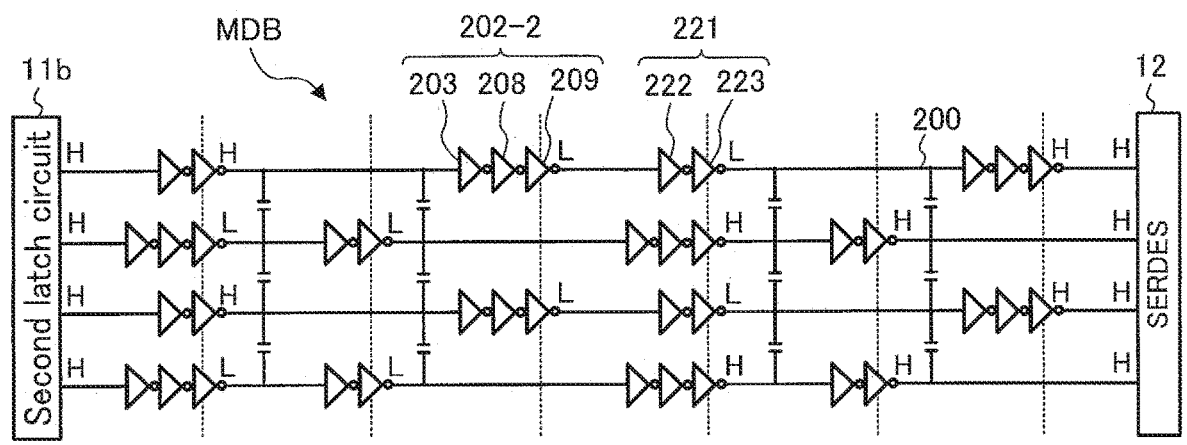
F I G. 17A
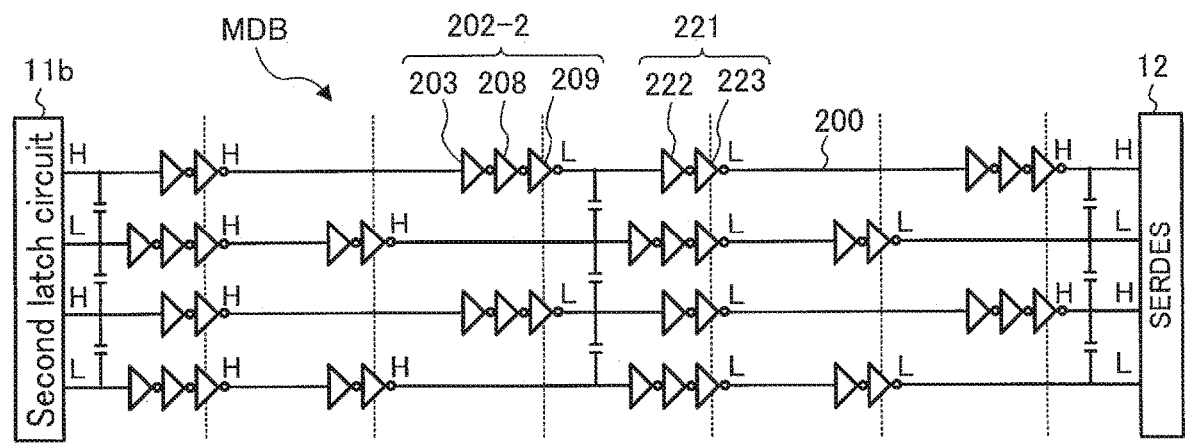
F I G. 17B

SEMICONDUCTOR MEMORY DEVICE

CROSS-REFERENCE TO RELATED APPLICATIONS

This application is based upon and claims the benefit of priority from Japanese Patent Application No. 2018-240048, filed Dec. 21, 2018, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 2 is a block diagram of a plane in the semiconductor memory device according to the first embodiment.

FIG. 6 is a circuit diagram of each repeater buffer circuit shown in FIG. 5.

FIG. 7 is a circuit diagram of a flip flop-containing bidirectional repeater buffer circuit provided in a latch circuit at the end of the main data bus in the semiconductor memory device according to the first embodiment.

FIG. 12A is a diagram showing a data capture window pertinent to a read operation in a comparative example.

FIG. 12B and FIG. 12C each show a data capture window pertinent to a read operation in the semiconductor memory device according to the first embodiment.

FIG. 15A is a diagram showing crosstalks due to the capacity between adjacent wires that occur when same-level data signals are conveyed through respective lines in a main data bus, where repeater buffer circuits are arranged, in a semiconductor memory device according to a first modification of the second embodiment.

FIG. 15B is a diagram showing crosstalks due to the capacity between adjacent wires that occur when different-level data signals are conveyed through neighboring lines in the main data bus, where the repeater buffer circuits are arranged, in the semiconductor memory device according to the first modification of the second embodiment.

FIG. 17A is a diagram showing crosstalks due to the capacity between adjacent wires that occur when same-level data signals are conveyed through respective lines in a main data bus, where repeater buffer circuits are arranged, in a semiconductor memory device according to a third modification of the second embodiment.

FIG. 17B is a diagram showing crosstalks due to the capacity between adjacent wires that occur when different-level data signals are conveyed through neighboring lines in the main data bus, where the repeater buffer circuits are arranged, in the semiconductor memory device according to the third modification of the second embodiment.

DETAILED DESCRIPTION

In general, according to one embodiment, a semiconductor memory device includes: a memory cell array including a plurality of memory cells; a conversion circuit configured to convert parallel data into serial data, and serial data into parallel data; a data bus including a first data line and a second data line, the data bus configured to transmit data signals between the memory cell array and the conversion circuit concurrently through the first data line and the second data line; a first buffer and a second buffer on the first data line; and a third buffer on the second data line. The data bus includes a first wiring part extending along a first direction. The first buffer and the second buffer are separate from each other on the first data line in the first wiring part. The third buffer is on the second data line in the first wiring part. The first to third buffers are at different positions along the first direction.

Embodiments will be described with reference to the drawings. The description will use same reference symbols for the structural features or components having the same or substantially the same functions and configurations. Also, each embodiment will be set forth as an example of devices or methods for implementing the technical ideas of the embodiment, and these technical ideas do not limit materials, shapes, structures, arrangements, or the like of the components, etc. to the following description. The technical ideas tolerate various modifications within the scope of claims.

1. First Embodiment

A semiconductor memory device according to the first embodiment will be described. The description will assume the semiconductor memory device to be a NAND flash memory of a three-dimensional stack type, constituted by memory cell transistors three-dimensionally stacked above a semiconductor substrate.

1.1 Overall Configuration of Semiconductor Memory Device

Figure 1:
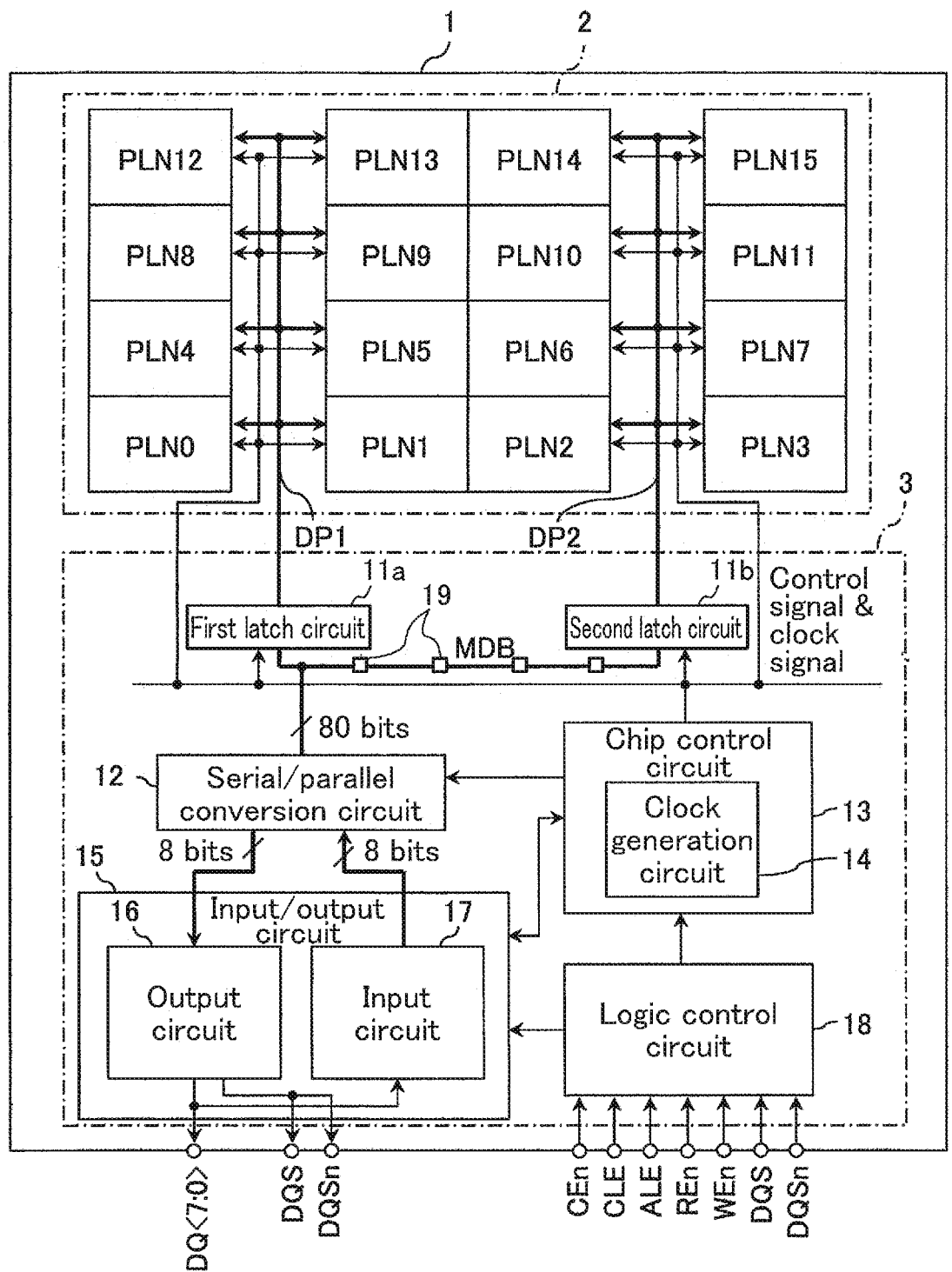
FIG. 1 is a block diagram of a semiconductor memory device according to a first embodiment.

The description starts with the overall configuration of the semiconductor memory device with reference to FIG. 1. While FIG. 1 gives an example where many connections between block entities are indicated by arrows, the embodiment may adopt other forms of connections, as well.

As shown in FIG. 1, a semiconductor memory device 1 includes, in general terms, a core part 2 and a peripheral circuitry part 3.

The core part 2 includes, for example, 16 planes PLN's (PLN0 to PLN15). The planes PLN's each serve as a unit to perform data write and data read with corresponding memory cell transistors. As will be described in more detail, each plane PLN includes multiple blocks, and row decoders and sense amplifiers for selecting the memory cells in the blocks. As such, the planes PLN0 to PLN15 can operate independently of one another, and the configuration involving these multiple planes allows for parallel, concurrent operations of the planes. For example, a write operation for one plane and an erase operation for another plane can proceed temporally in parallel with each other.

The planes PLN0 to PLN15 according to the embodiment may be of the same configuration. Also, for example, the planes PLN0 to PLN15 may be provided in a matrix arrangement of 4 rows and 4 columns. In the example shown in FIG. 1, the planes PLN0, PLN4, PLN8, and PLN12 are arranged in one column, and the planes PLN1, PLN5, PLN9, and PLN13 are arranged in another column, such that these planes PLN's are connected to a common, first data path DP1. Likewise, the planes PLN2, PLN6, PLN10, and PLN14 are arranged in one column, and the planes PLN3, PLN7, PLN11, and PLN15 are arranged in another column, such that these planes PLN's are connected to a common, second data path DP2. The first data path DP1 and the second data path DP2 each are, for example, an 80-bit bus. However, the first data path DP1 and the second data path DP2 are not limited to the 80-bit width, i.e., a constitution of 80 data lines.

Next, the peripheral circuitry part 3 will be described. The peripheral circuitry part 3 includes a first latch circuit 11a, a second latch circuit 11b, a serial/parallel conversion circuit 12, a chip control circuit 13, an input/output circuit 15, a logic control circuit 18, a main data bus MDB, and repeater buffer circuits 19's.

The main data bus MDB is, for example, an 80-bit width bus similar to the first data path DP1 and the second data path DP2, and may in practice be a set of 80 data lines. The main data bus MDB is adapted to transfer, in the course of a data read operation, data read from the core part 2 via the first data path DP1 or the second data path DP2 to the serial/parallel conversion circuit 12. The main data bus MDB is also adapted to transfer, in the course of a data write operation, data from the serial/parallel conversion circuit 12 to the first data path DP1 or the second data path DP2 for the core part 2.

The first latch circuit 11a couples the first data path DP1 and the main data bus MDB. The first latch circuit 11a is adapted to operate based on clock signals from the chip control circuit 13, so that in the course of a data read operation, it latches data from the first data path DP1 and passes this data to the main data bus MDB. In the course of a data write operation, it passes data from the main data bus MDB to the first data path DP1. As such, the first latch circuit 11a here includes 80 flip flops (not illustrated in FIG. 1) corresponding to the 80-bit bus, i.e., respective 80 data lines.

The second latch circuit lib, similar to the first latch circuit 11a, couples the second data path DP2 and the main data bus MDB. The second latch circuit lib is adapted to operate based on clock signals from the chip control circuit 13, so that in the course of a data read operation, it latches data from the second data path DP2 and passes this data to the main data bus MDB. In the course of a data write operation, it passes data from the main data bus MDB to the second data path DP2. As such, the second latch circuit 11b here includes 80 flip flops (not illustrated in FIG. 1) corresponding to the 80-bit bus, i.e., respective 80 data lines.

The serial/parallel conversion circuit 12 is for converting serial data into parallel data, and parallel data into serial data. More specifically, the serial/parallel conversion circuit 12 is adapted to operate based on instructions from the chip control circuit 13, so that in the course of a data read operation, it converts 80 bits×1 cycle parallel data received from the main data bus MDB into 8 bits×10 cycles serial data. It then transmits the obtained serial data to the input/output circuit 15 including a later-described output circuit 16. In the course of a data write operation, the serial/parallel conversion circuit 12 converts 8 bits×10 cycles serial data received from the input/output circuit 15 including a later-described input circuit 17, into 80 bits×1 cycle parallel data. It then outputs the obtained parallel data to the main data bus MDB.

Note that the serial/parallel conversion circuit 12 is coupled to a portion of the main data bus MDB, which is not at the center of the main data bus MDB but which is at a position, for example, closer to the first latch circuit 11a than to the second latch circuit 11b as in the exemplary configuration shown in FIG. 1. In other words, the distance between the serial/parallel conversion circuit 12 and the first latch circuit 11a (i.e., the length of the lines for transferring data to the first latch circuit 11a) is smaller than the distance between the serial/parallel conversion circuit 12 and the second latch circuit 11b (i.e., the length of the lines for transferring data to the second latch circuit 11b). As a matter of course, the serial/parallel conversion circuit 12 may instead be closer to the second latch circuit 11b. The description will assume instances where the serial/parallel conversion circuit 12 is closer to the first latch circuit 11a.

The repeater buffer circuits 19's are each disposed on the main data bus MDB. More specifically, one or more repeater buffer circuits 19's may be disposed on each of the 80 data lines. The repeater buffer circuits 19's each are a circuit for restoring the normal state of data signals having been degraded during transmission, and relaying these data signals. More specifically, each repeater buffer circuit 19 is adapted to, for example, shape the waveform of received signals, perform amplitude adjustment, etc., as needed, remove noise from the received signals, and output the resultant signals. In the context of this embodiment, the repeater buffer circuits 19's are provided in order to, for example, remedy issues of delay.

According to the example being discussed, the distance along the lines between the second latch circuit 11b and the serial/parallel conversion circuit 12 (the lines may collectively be called "longer wiring side") is larger than the distance along the lines between the first latch circuit 11a and the serial/parallel conversion circuit 12 (the lines may collectively be called "shorter wiring side"). The term "distance" used herein intends, for the respective case, a distance along the shortest signal path between the second latch circuit 11b and the serial/parallel conversion circuit 12, and a distance along the shortest signal path between the first latch circuit 11a and the serial/parallel conversion circuit 12. More specifically, the data lines between the second latch circuit 11b and the serial/parallel conversion circuit 12 are assumed to have their respective multiple signal paths, and the data lines between the first latch circuit 11a and the serial/parallel conversion circuit 12 are assumed to have their respective multiple signal paths. On these assumptions, the comparison between the distance from the second latch circuit 11b to the serial/parallel conversion circuit 12 along the data lines and the distance from the first latch circuit 11a to the serial/parallel conversion circuit 12 along the data lines will be made based on the respective shortest signal paths of the former and the latter.

In the main data bus MDB, the repeater buffer circuits 19's are disposed only on the longer wiring side, not on the shorter wiring side. The repeater buffer circuits 19's will be described in more detail later. If, contrary to what is shown in FIG. 1, the longer wiring side is provided between the first latch circuit 11a and the serial/parallel conversion circuit 12 and the shorter wiring side is provided between the second latch circuit 11b and the serial/parallel conversion circuit 12, the repeater buffer circuits 19's may be arranged between the first latch circuit 11a and the serial/parallel conversion circuit 12.

The chip control circuit 13 takes control over operations of the entire semiconductor memory device 1. More specifically, the chip control circuit 13 is adapted to control write operations, read operations, and erase operations with each plane PLN, based on various control signals transmitted from the logic control circuit 18 and various commends transmitted from the input/output circuit 15. The chip control circuit 13 is also adapted to control the core part 2, the first latch circuit 11a, the second latch circuit 11b, the serial/parallel conversion circuit 12, the input/output circuit 15, the repeater buffer circuits 19's, and so on. The chip control circuit 13 includes a clock generation circuit 14.

The clock generation circuit 14 is adapted to generate various clock signals to be supplied to each plane PLN, the first latch circuit 11a, the second latch circuit 11b, the serial/parallel conversion circuit 12, and the input/output circuit 15. More specifically, and for example, the clock generation circuit 14 may generate a first clock signal to the transmitted to the planes PLN's, and a second clock signal to be transmitted to the first latch circuit 11a and the second latch circuit 11b. Each plane PLN performs data input and output with the corresponding first data path DP1 or second data path DP2, based on the received first clock signal. The first latch circuit 11a and the second latch circuit 11b each latch data based on the received second clock signal. The clock generation circuit 14, for example, generates clock signals for read operations, based on read enable signals REn's, etc., received from an external controller (not illustrated).

The input/output circuit 15 is adapted to control input and output of signals DQ's with the external controller. The signals DQ's may be, for example, data, addresses, and commands. The input/output circuit 15 includes the input circuit 17 and the output circuit 16 mentioned above. The input circuit 17 is adapted to transmit data (write data) received from the external controller to the serial/parallel conversion circuit 12, and also transmit addresses to each applicable plane PLN via an address register (not illustrated) and commands to the chip control circuit 13 via a command register (not illustrated). The output circuit 16 is adapted to temporarily latch data (read data) received from the serial/parallel conversion circuit 12 based on the clock signal from the chip control circuit 13, and then output the data together with a clock signal DQS and a complementary clock signal DQSn to the external controller.

The logic control circuit 18 is adapted to receive various signals from the external controller, such as a chip enable signal CEn, a command latch enable signal CLE, an address latch enable signal ALE, a write enable signal WEn, and a read enable signal REn, as well as the clock signal DQS and the complementary clock signal DQSn. The logic control circuit 18 is adapted to control the input/output circuit 15 and the chip control circuit 13 according to the received signals.

The chip enable signal CEn is for placing the semiconductor memory device 1 in an enabled state. The command latch enable signal CLE indicates that the signal DQ is a command. The address latch enable signal ALE indicates that the signal DQ is an address. The write enable signal WEn is for importing received signals into the semiconductor memory device 1, and is asserted each time a command, an address, data, or the like is received from the external controller. The semiconductor memory device 1 is adapted to take in the signal DQ in synchronization with the write enable signal WEn. The read enable signal REn is for allowing data to be read from the semiconductor memory device 1 by the external controller, and is toggled at the time of data read. The semiconductor memory device 1 is adapted to output the signal DQ to the external controller, based on the read enable signal REn. The clock signal DQS and the complementary clock signal DQSn are for controlling the input and output timings of the signal DQ.

1.2 Configuration of Plane

Referring to FIG. 2, the configuration that may be adopted by each plane PLN will be described. FIG. 2 shows the plane PLN0 as an example, and the other planes PLN's may be of similar configurations.

As shown in FIG. 2, each plane PLN includes a memory cell array 30, row decoders 31a and 31b, column decoders 32a and 32b, 5 sense amplifiers 33's, 5 page buffers 34's, and 5 input/output buffers 35's.

The memory cell array 30 includes 5 division blocks Div's (Div0 to Div4) each including nonvolatile memory cell transistors (which may also be called "memory cells") associated with rows and columns. The division blocks Div's each include multiple string units SU's (SU0, SU1, SU2, and SU3). These string units SU's each include multiple NAND strings NS's. Note that FIG. 2 omits illustrations of the NAND strings NS's in the string units SU1 to SU3 for the sake of simplification.

The number of the division blocks Div's in the memory cell array 30, the number of the string units SU's in each division block Div, and the number of the NAND strings NS's may be discretionarily determined.

The row decoders 31a and 31b are adapted to decode row addresses and select the string units SU's corresponding to the results of decoding. The row decoders 31a and 31b then apply required voltages to the selected string units SU's.

The column decoders 32a and 32b are adapted to decode column addresses and select the sense amplifiers 33's and latch circuits in the page buffers 34's corresponding to the results of decoding.

The 5 sense amplifiers 33's are provided for the respective 5 division blocks Div0 to Div4. For a read operation, the sense amplifiers 33's are each adapted to sense data read from the corresponding division block Div. The sense amplifiers 33's transmit the read data to the respective page buffers 34's. Also, for a write operation, the sense amplifiers 33's are each adapted to transmit write data to the corresponding division block Div.

The 5 page buffers 34's are provided for the respective 5 division blocks Div0 to Div4. Each page buffer 34 includes multiple latch circuits (not illustrated) to hold write data and read data. In an exemplary write operation, the page buffer 34 is adapted to temporarily hold write data received from the corresponding input/output buffer 35, and transmit the write data to the corresponding sense amplifier 33. Also, in an exemplary read operation, the page buffer 34 is adapted to temporarily hold read data received from the corresponding sense amplifier 33, and transmit the read data to the corresponding input/output buffer 35. This embodiment assumes that the data transfers between the page buffers 34's and the respective input/output buffers 35's are performed in a unit of 16 bits.

The 5 input/output buffers 35's are provided for the respective 5 division blocks Div0 to Div4, and each adapted to perform input and output of 16-bit data DAT with the first data path DP1. Input or output data for the input/output buffer 35 corresponding to the division block Div0 may be called "data DAT<15:0>". Similarly, input or output data for the input/output buffer 35 corresponding to the division block Div1 may be called "data DAT<31:16>". Input or output data for the input/output buffer 35 corresponding to the division block Div2 may be called "data DAT<47:32>". Input or output data for the input/output buffer 35 corresponding to the division block Div3 may be called "data DAT<63:48>". Input or output data for the input/output buffer 35 corresponding to the division block Div4 may be called "data DAT<79:64>". As such, one plane PLN is adapted to handle input and output of 80-bit data, which may be called "data DAT<79:0>", with the applicable data path.

The input/output buffers 35's each include 16 data input/output circuits 36's. Each data input/output circuit 36 is adapted to perform input and output of 1-bit data DAT based on a first clock signal CLK1 received from the clock generation circuit 14. For the division block Div0, there are 16 data input/output circuits 36_0 to 36_15 to deal with data DAT<0> to data DAT<15>. Similarly, for the division block Div1, there are 16 data input/output circuits 36_16 to 36_31 to deal with data DAT<16> to data DAT<31>. For the division block Div2, there are 16 data input/output circuits 36_32 to 36_47 to deal with data DAT<32> to data DAT<47>. For the division block Div3, there are 16 data input/output circuits 36_48 to 36_63 to deal with data DAT<48> to data DAT<63>. For the division block Div4, there are 16 data input/output circuits 36_64 to 36_79 to deal with data DAT<64> to data DAT<79>.

These data input/output circuits 36's each include a flip flop (not illustrated) to latch data based on the first clock signal CLK1. For a write operation, each data input/output circuit 36 is adapted to transmit data DAT (write data) input via the first data path DP1 to the corresponding page buffer 34. For a read operation, each data input/output circuit 36 is adapted to output data received from the corresponding page buffer 34 to the first data path DP1. The data input/output circuits 36's may follow the double data rate (DDR) technique or the single data rate (SDR) technique for outputting data to the first data path DP1 based on the first clock signals CLK1's. The description will assume that the data output by the data input/output circuits 36's is performed according to the DDR technique.

Note that the foregoing explanation has used the plane PLN0 as an example, and the other planes PLN's may include similar components. The planes PLN1, PLN4, PLN5, PLN8, PLN9, PLN12, and PLN13 also adopt their input/output buffers 35's for data input and output with the first data path DP1, while the planes PLN2, PLN3, PLN6, PLN7, PLN10, PLN11, PLN 14, and PLN15 adopt their input/output buffers 35's for data input and output with the second data path DP2.

1.3 Configuration of Memory Cell Array

Figure 3:
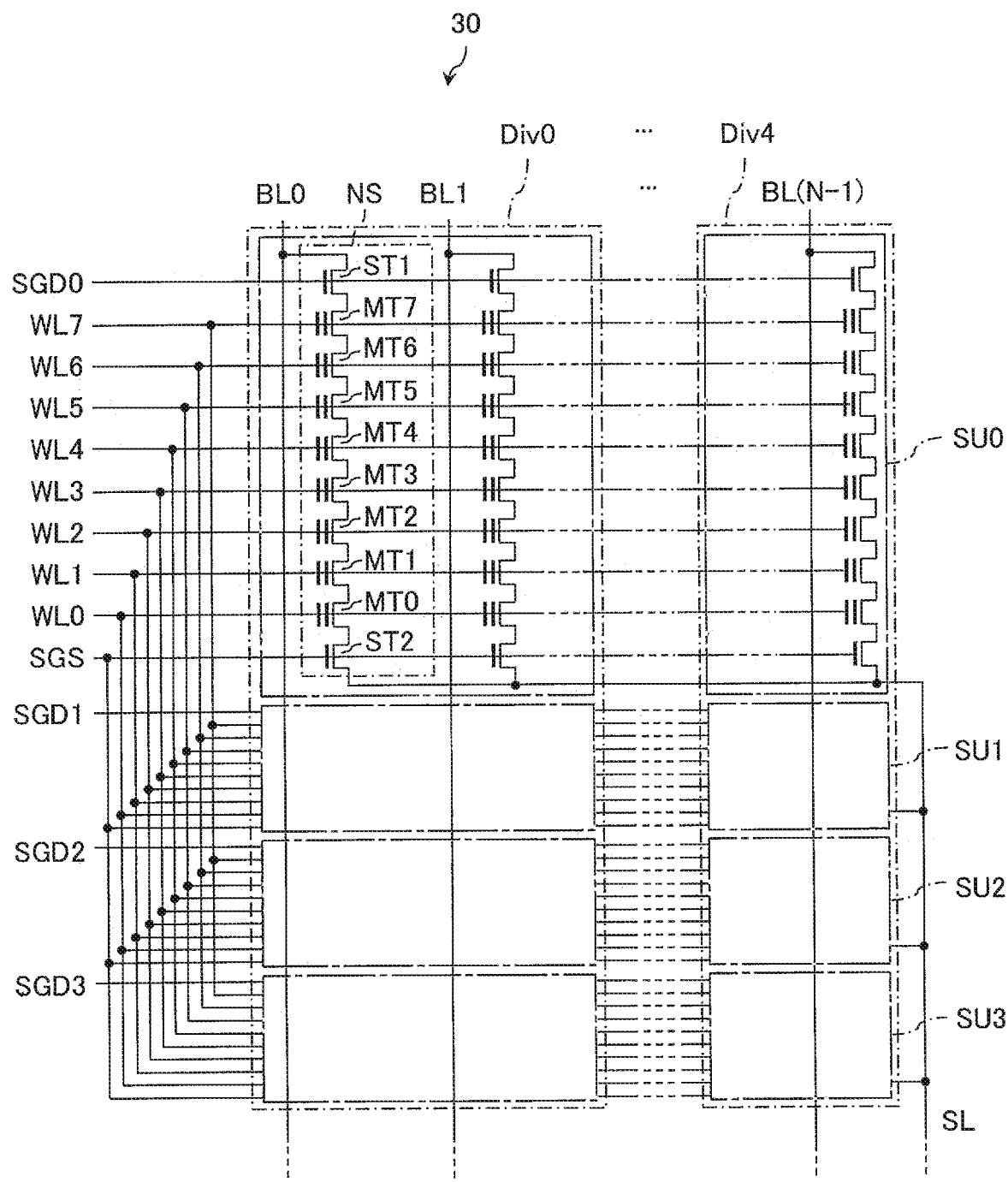
FIG. 3 is a circuit diagram of a memory cell array in the semiconductor memory device according to the first embodiment.
Figure 4:
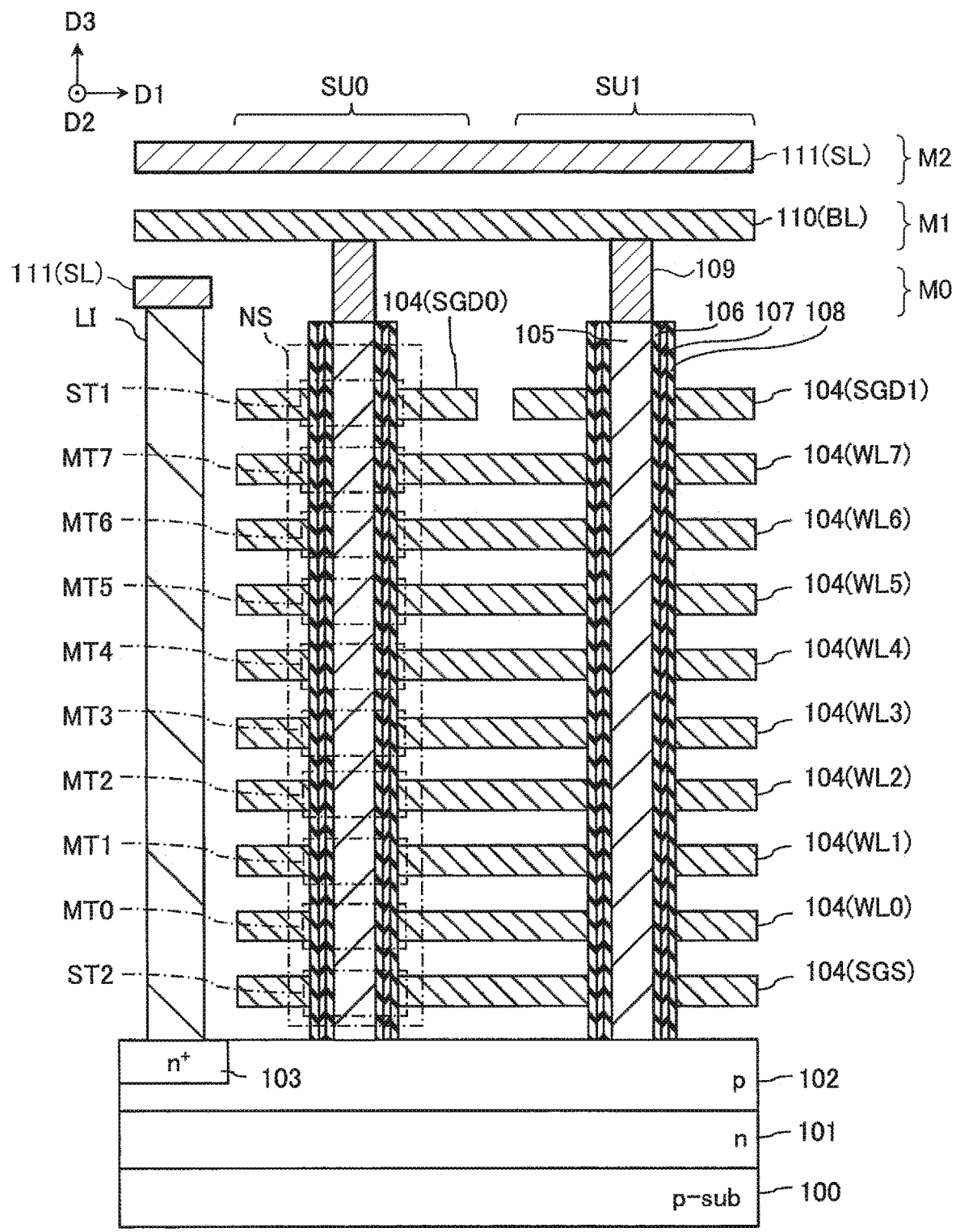
FIG. 4 is a sectional view of the memory cell array in the semiconductor memory device according to the first embodiment.

Next, referring to FIGS. 3 and 4, description will be given of how each memory cell array may be configured. FIG. 3 is a circuit diagram of the memory cell array 30 in the plane PLN0, and FIG. 4 is a sectional view of the memory cell array 30. The other planes PLNs may be of similar configurations. Note that, for simplification, FIG. 4 omits illustrations of inter-layer insulating films.

As shown in FIG. 3, the NAND strings NS's each include, for example, 8 memory cell transistors MT0 to MT7, a select transistor ST1, and a select transistor ST2. In the below description, the memory cell transistors MT0 to MT7 may be called "memory cell transistors MT's" where no distinction needs to be given. The memory cell transistors MT's each include a control gate and a charge accumulating layer, and are adapted to retain data in a non-volatile manner. Each memory cell transistor MT changes its threshold voltage according to the number of electrons accumulated by the own charge accumulating layer, so that information corresponding to the change in the threshold voltage is held. The memory cell transistors MT's may be of a MONOS type that adopts an insulating film for the charge accumulating layer, or may be of a FG type that adopts a conductive layer for the charge accumulating layer. The description will assume the memory cell transistors MT's to be of a MONOS type, by way of example. Also, the number of the memory cell transistors MT's is not limited to 8, but may be discretionarily determined to be, for example, 16, 32, 64 or 128. Moreover, the numbers of the select transistors ST1 and ST2 are also discretionary, as long as there are one or more of each in one NAND string NS.

The memory cell transistors MT's are coupled in series between the source of the select transistor ST1 and the drain of the select transistor ST2. More specifically, current paths of the memory cell transistors MT0 to MT7 are connected in series. The drain of the memory cell transistor MT7 is coupled to the source of the select transistor ST1, and the source of the memory cell transistor MT0 is coupled to the drain of the select transistor ST2.

The string units SU0 to SU3 in each of the division blocks Div0 to Div4 include their respective, multiple select transistors ST1's whose gates are coupled to respective one of common select gate lines SGD0 to SGD3. In other words, the select gate lines SGD0 to SGD3 each provide a common connection to the NAND strings NS's in the applicable string units SU's across the division blocks Div's. Each of the select gate lines SGD0 to SGD3 is connected to the row decoder 31a or 31b. In the below description, the select gate lines SGD0 to SGD3 may each be called "select gate line SGD" where no distinction needs to be given.

The string units SU0 to SU3 in each of the division blocks Div0 to Div4 include their respective, multiple select transistors ST2's whose gates are coupled to a common select gate line SGS.

The memory cell transistors MT0's to MT7's in the memory cell array 30 have their control gates coupled to common word lines WL0 to WL7, respectively. That is, the word lines WL0 to WL7 provide common connections to the respective memory cell transistors MT0's to MT7's across the division blocks Div's. Each of the word lines WL0 to WL7 is connected to the row decoder 31a or 31b. In the below description, the word lines WL0 to WL7 may each be called "word line WL" where no distinction needs to be given.

In the string units SU's in the division blocks Div0 to Div4, the select transistors ST1's of the respective NAND strings NS's have their drains coupled to different bit lines BL0 to BL(N−1), where N is any integer. The bit lines BL0 to BL(N−1) are each connected to the sense amplifier 33 for the corresponding division block Div. In the below description, the bit lines BL0 to BL(N−1) may each be called "bit line BL" where no distinction needs to be given. The sources of the multiple select transistors ST2's are coupled to a common source line SL.

Write and read operations are each performed at a time for the memory cell transistors MT's coupled to given word line WL in given string unit SU.

Next, the sectional structure of the memory cell array 30 will be described. FIG. 4, by way of example, shows a cross section at the string units SU0 and SU1. The string units SU2 and SU3 may have a similar cross section. FIG. 4 omits illustrations of inter-layer insulating films.

As shown in FIG. 4, there are a source line contact LI and the string units SU's arranged along a first direction D1 parallel to a semiconductor substrate 100 and extending in a second direction D2 parallel to the semiconductor substrate 100 and perpendicular to the first direction D1.

In each of the string units SU's, the NAND strings NS's are each formed along a third direction D3 perpendicular to the semiconductor substrate 100. More specifically, an n-type well 101 is provided in the surface region of the semiconductor substrate 100. A p-type well 102 is provided in the surface region of the n-type well 101. The p-type well 102 includes an $n^+$-type diffusion layer 103 at a portion of its surface region. Above the p-type well 102 is a stack of 10 interconnect layers 104's functioning as the select gate line SGS, the word lines WL0 to WL7 coupled to the memory cell transistors MT0's to MT7's, and the select gate line SGD, respectively. These interconnect layers 104's are sequentially stacked via an inter-layer insulating film (not illustrated). The interconnect layer 104 intended to function as the select gate line SGD is divided into portions for the respective string units SU's. According to the example shown in FIG. 4, one of such portions of the same stack level-interconnect layer 104 functions as the select gate line SGD0 and the other functions as the select gate line SGD1, and they extend in the second direction D2 separately. The other interconnect layers 104's may each serve as a common layer in the division blocks Div's.

There are multiple pillar-like semiconductor layers 105's each penetrating through the 10 interconnect layers 104's up to the p-type well 102. Each semiconductor layer 105 is laterally and sequentially surrounded by a tunnel insulating film 106, a charge accumulating layer 107, and a block insulating film 108. The semiconductor layer 105 is constituted by, for example, polycrystalline silicon. The tunnel insulating film 106 and the block insulating film 108 are each constituted by, for example, a silicon oxide film. The charge accumulating layer 107 is constituted by, for example, a silicon nitride film. The semiconductor layer 105 functions as a current path for each applicable NAND string NS, and serves as a region where each transistor forms a channel. The semiconductor layer 105 has its top end coupled to, via a contact plug 109, an interconnect layer 110 extending in the first direction D1. The interconnect layer 110 functions as the applicable bit line BL. Note that while FIG. 4 shows the example with one interconnect layer 104 functioning as the select gate line SGD (SGD0, SGD1) and one interconnect layer 104 functioning as the select gate line SGS, the embodiment may adopt multiple interconnect layers 104 functioning as these gate lines.

The source line contact LI is linear along the second direction D2. The source line contact LI is constituted by, for example, polycrystalline silicon. The source line contact LI has its bottom face connected to the n+-type diffusion layer 103 and the top face connected to an interconnect layer 111 that functions as the source line SL above the semiconductor substrate 100 and the NAND strings NS's. This interconnect layer 111 functioning as the source line SL may also be located above the interconnect layer 110 functioning as the bit line BL. As such, the semiconductor memory device 1 includes 3 metal interconnect layers, i.e., the lowermost layer M0, the layer M1 above the layer M0, and the layer M2 above the layer M1.

Note that the source line contact LI and the NAND strings NS's may be freely arranged. For example, the source line contact LI may be disposed between the string units SU1 and SU2. Moreover, while FIG. 4 shows the example where the NAND strings NS's in one string unit SU are aligned in line along the second direction D2 for the sake of simplified explanation, the embodiment tolerates any arrangement of the NAND strings NS's in one string unit SU. For example, the NAND strings NS's may be arranged in 2 lines extending in parallel with each other in the second direction D2, or may be arranged in 4 lines in a staggered pattern along the second direction D2.

1.4 Configuration of Main Data Bus

Figure 5:
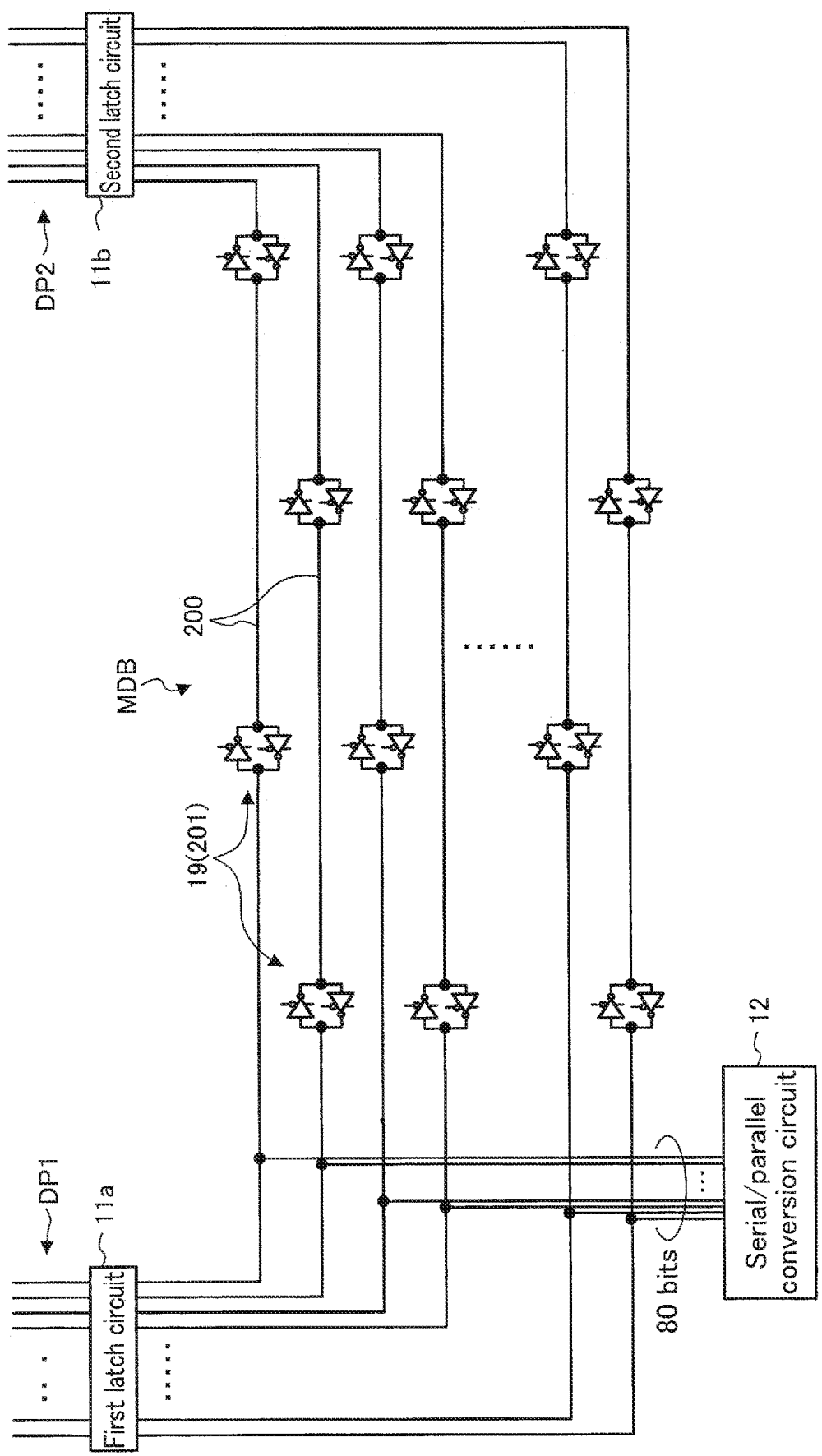
FIG. 5 is a diagram showing positional relationships between repeater buffer circuits arranged on a main data bus in the semiconductor memory device according to the first embodiment.

Referring to FIG. 5, the configuration of the main data bus MDB will be described. FIG. 5 is a circuit diagram including the main data bus MDB and the repeater buffer circuits 19's. For simplification, FIG. 5 illustrates only 6 lines of, for example, 80 data lines 200's constituting the main data bus MDB, and is intended to particularly show the positional relationships between the repeater buffer circuits 19's arranged on the data lines. The other 74 data lines 200's, omitted from the figure, may have the repeater buffer circuits 19's in a similar layout.

As shown in FIG. 5, the 80 data lines 200's are parallel to one another. As previously described, these data lines 200's are connected with the first latch circuit 11a at one end, and connected with the second latch circuit 11b at the other end. Each data line 200 is provided with 2 repeater buffer circuits 19's. The 2 repeater buffer circuits 19's are disposed between the second latch circuit 11b and a point of connection between the own data line 200 and the serial/parallel conversion circuit 12. The 2 repeater buffer circuits 19's on one data line 200 and the 2 repeater buffer circuits 19's on the neighboring data line 200 are arranged at alternate positions.

For example, according to the exemplary arrangement shown in FIG. 5, the first one of the 2 repeater buffer circuits 19's on each of the odd-numbered (1st, 3rd, 5th, ...) data lines 200's is arranged at approximately the center position of the own data line 200, and the other, second repeater buffer circuit 19 is arranged at a position closer to the second latch circuit 11b. The first repeater buffer circuits 19's are together aligned in line along the direction orthogonal to the extending direction of the data lines 200's, and the second repeater buffer circuits 19's are also aligned in line together along the direction orthogonal to the extending direction of the data lines 200's. As such, the group of the first repeater buffer circuits 19's and the group of the second repeater buffer circuits 19's are both orthogonal to the direction along the data lines 200's, while being in parallel with each other.

Meanwhile, the first one of the 2 repeater buffer circuits 19's on each of the even-numbered (2nd, 4th, 6th, ...) data lines 200's is arranged at a position between the group of the first repeater buffer circuits 19's on the odd-numbered data lines 200's and the serial/parallel conversion circuit 12, in the direction along the data lines 200's. Also, the other, second one of the 2 repeater buffer circuits 19's on each even-numbered data line 200 is arranged at a position between the group of the first repeater buffer circuits 19's and the group of the second repeater buffer circuits 19's on the odd-numbered data lines 200's, in the direction along the data lines 200's.

In an exemplary arrangement, the second repeater buffer circuit 19 on each even-numbered data line 200 is located at a position corresponding to the approximate half point of the line length between the first and the second repeater buffer circuits 19's on any odd-numbered data line 200. To put it another way, the first repeater buffer circuit 19 on each odd-numbered data line 200 is located at a position corresponding to the approximate half point of the line length between the first and second repeater buffer circuits 19's on any even-numbered data line 200.

Similar to the arrangement on the odd-numbered data lines 200's, the group of the first repeater buffer circuits 19's and the group of the second repeater buffer circuits 19's on the even-numbered data lines 200's are both orthogonal to the direction along the data lines 200's, while being in parallel with each other.

The repeater buffer circuits 19's according to the embodiment may each be, for example, a bidirectional repeater buffer circuit of an inverter type. The circuit diagram given in FIG. 6 will be referred to for such an inverter-type bidirectional repeater buffer circuit.

As shown in FIG. 6, an inverter-type bidirectional repeater buffer circuit 201 includes 2 inverter-type repeater buffers 202-1 and 202-2.

For example, the repeater buffer 202-1 is used for data write operations. The repeater buffer 202-1 includes an inverter 203, a NAND circuit 204, a NOR circuit 205, a p-channel MOS transistor 206, and an n-channel MOS transistor 207. The inverter 203 has its input terminal connected to a first input/output terminal IOPD. The first input/output terminal IOPD is connected to the data line 200 on the side of the serial/parallel conversion circuit 12. That is, the inverter 203 is adapted to invert write data transferred via the data line 200. The NAND circuit 204 is adapted to perform a NAND operation using the output signal from the inverter 203 and a write signal WRITE. The signal WRITE is a control signal supplied from the chip control circuit 13 and turns a high ("H") level at data write. The NOR circuit 205 is adapted to perform a NOR operation using the output signal from the inverter 203 and an inverted signal WRITEn of the write signal WRITE. The p-channel MOS transistor 206 receives the operation result from the NAND circuit 204 through its gate, receives application of a voltage VDD through its source, and has its drain connected to a second input/output terminal IOCR. The second input/output terminal IOCR is the data line 200 on the side of the second latch circuit 11b. The n-channel MOS transistor 207 receives the operation result from the NOR circuit 205 through its gate, receives application of a voltage VSS (a voltage which may be smaller than the voltage VDD and is, for example, 0V) through its source, and has its drain connected to the second input/output terminal IOCR. With such connections, the NAND circuit 204 and the NOR circuit 205 are adapted to function as an inverter 208, and the p-channel MOS transistor 206 and the n-channel MOS transistor 207 are also adapted to function as an inverter 209. As such, the inverter-type repeater buffer 202-1 for use in data write operations includes the inverters 203, 208, and 209 as three stages. The inverter-type repeater buffer 202-1 is therefore capable of outputting a low ("L") level signal to the second input/output terminal IOCR upon receipt of a high ("H") level input signal from the first input/output terminal IOPD, and outputting a "H" level signal to the second input/output terminal IOCR upon receipt of a "L" level input signal from the first input/output terminal IOPD.

The repeater buffer 202-2 is, for example, used for read operations. The repeater buffer 202-2 has a configuration similar to the repeater buffer 202-1. However, its NAND circuit 204 is adapted to perform a NAND operation using the output signal from the own inverter 203 and a read signal READ, and its NOR circuit 205 is adapted to perform a NOR operation using the output signal from the own inverter 203 and an inverted signal READn of the read signal READ. The signal READ is a control signal supplied from the chip control circuit 13 and turns a "H" level at data read. The inverter-type repeater buffer 202-2 for use in data read operations is therefore capable of outputting a "L" level signal to the first input/output terminal IOPD upon receipt of a "H" level input signal from the second input/output terminal IOCR, and outputting a "H" level signal to the first input/output terminal IOPD upon receipt of a "L" level input signal from the second input/output terminal IOCR.

1.5 Configurations of Latch Circuits 11a and 11b

Next, the configurations of the first latch circuit 11a and the second latch circuit 11b will be described. As previously discussed, the first and the second latch circuits 11a and 11b each include 80 flip flops for the respective 80 data lines 200's. For example, the first and the second latch circuits 11a and 11b according to the embodiment include a flip flop-containing bidirectional repeater buffer circuit 211 as shown in FIG. 7, for each of the data lines 200's.

As seen from FIG. 7, the flip flop-containing bidirectional repeater buffer circuit 211 includes 2 inverter-type repeater buffers 212-1 and 212-2, and a flip flop 213.

The repeater buffer 212-1 is, for example, used for data write operations. The repeater buffer 212-1 includes a NAND circuit 214, a NOR circuit 215, a p-channel MOS transistor 216, and an n-channel MOS transistor 217. There is a first input/output terminal IOPD connected to the corresponding data line 200. The NAND circuit 214 is adapted to perform a NAND operation using write data transferred via the data line 200 and a write signal WRITE from the chip control circuit 13. The NOR circuit 215 is adapted to perform a NOR operation using the write data transferred via the data line 200 and an inverted signal WRITEn of the write signal WRITE from the chip control circuit 13. The p-channel MOS transistor 216 receives the operation result from the NAND circuit 214 through its gate, receives application of a voltage VDD through its source, and has its drain connected to a second input/output terminal IOCR. For the first latch circuit 11a, the second input/output terminal IOCR is a data line in the first data path DP1. For the second latch circuit 11b, the second input/output terminal IOCR is a data line in the second data path DP2. The n-channel MOS transistor 217 receives the operation result from the NOR circuit 215 through its gate, receives application of a voltage VSS through its source, and has its drain connected to the second input/output terminal IOCR. With such connections, the NAND circuit 214 and the NOR circuit 215 are adapted to function as an inverter, and the p-channel MOS transistor 216 and the n-channel MOS transistor 217 are also adapted to function as an inverter. As such, the repeater buffer 212-1 for use in data write operations includes the inverters as two stages. The repeater buffer 212-1 is therefore capable of outputting a "H" level signal to the second input/output terminal IOCR upon receipt of a "H" level input signal from the first input/output terminal IOPD, and outputting a "L" level signal to the second input/output terminal IOCR upon receipt of a "L" level input signal from the first input/output terminal IOPD.

The repeater buffer 212-2 is, for example, used for read operations. This repeater buffer 212-2 has a configuration similar to the repeater buffer 212-1. Note that the flip flop 213 is arranged in the stage prior to the repeater buffer 212-2. The flip flop 213 is adapted to hold an input signal from the second input/output terminal IOCR according to a second clock signal CLK2 from the chip control circuit 13, that is, it holds signals of read data transmitted via the corresponding data line in the first data path DP1 or the second data path DP2. The NAND circuit 214 of the repeater buffer 212-2 is adapted to perform a NAND operation using the data signal held in the flip flop 213 and a read signal READ from the chip control circuit 13, and the NOR circuit 215 is adapted to perform a NOR operation using the data signal held in the flip flop 213 and an inverted signal READn of the read signal READ from the chip control circuit 13. The repeater buffer 212-2 for use in data read operations is therefore capable of outputting a "H" level signal to the first input/output terminal IOPD upon the flip flop 213 holding a "H" level input signal from the second input/output terminal IOCR, and outputting a "L" level signal to the first input/output terminal IOPD upon the flip flop 213 holding a "L" level input signal from the second input/output terminal IOCR.

Figure 8:
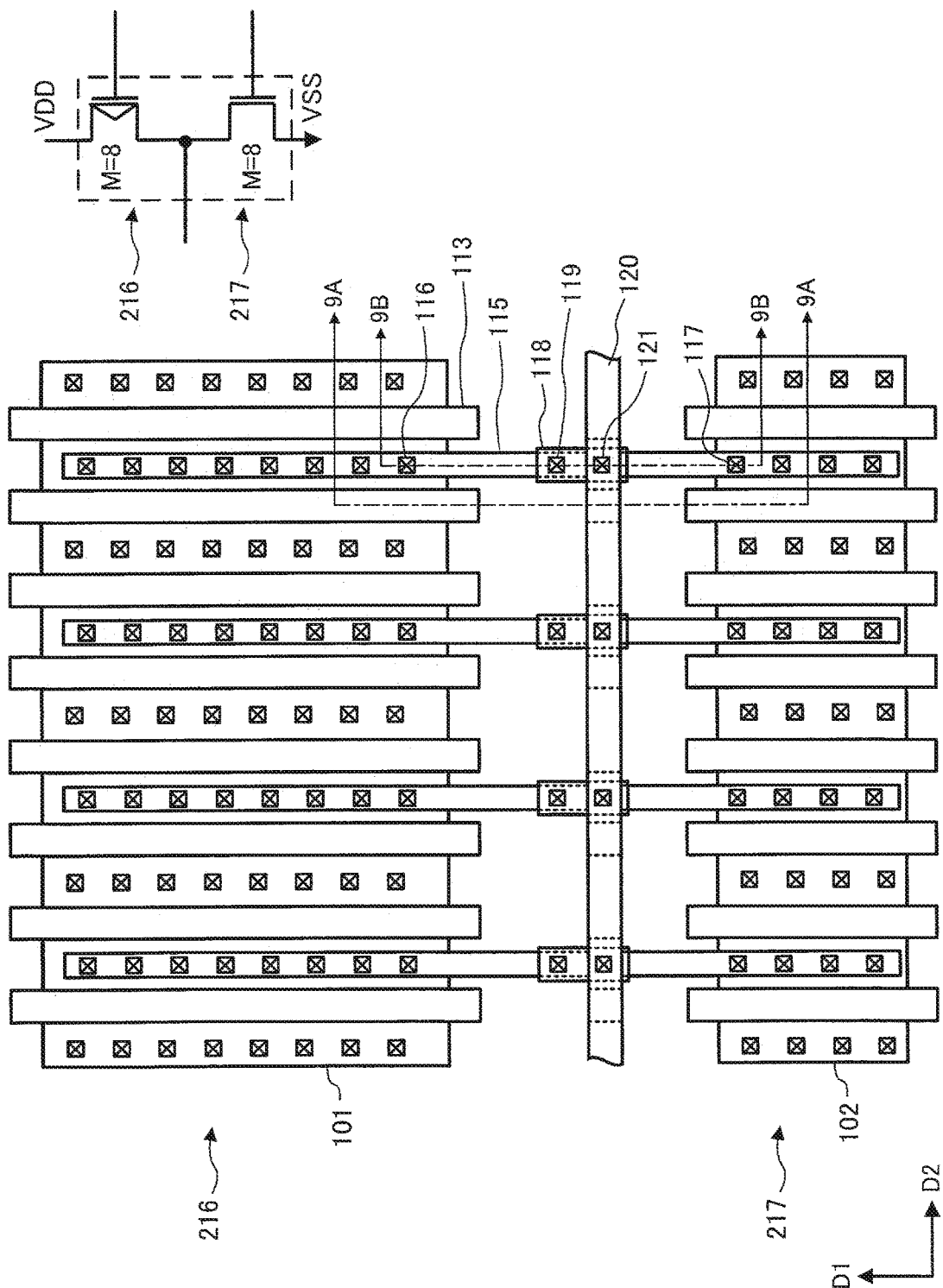
FIG. 8 includes a plan view and a circuit diagram showing final stage transistors of a read-side repeater buffer in the flip flop-containing bidirectional repeater buffer circuit shown in FIG. 7.

FIG. 8 gives a plan view and a circuit diagram including the p-channel MOS transistor 216 and the n-channel MOS transistor 217. Also, FIGS. 9A and 9B are sectional views taken along the line 9A-9A and the line 9B-9B shown in FIG. 8, respectively.

These transistors 216 and 217 are required to have a high drive ability to cope with a long line length up to the next repeater buffer circuit 19 on the corresponding data line 200 in the main data bus MDB. Thus, each of the p-channel MOS transistor 216 and the n-channel MOS transistor 217 includes multiple gate electrodes. FIG. 8 assumes an instance where there are 8 gate electrodes in each of the transistors 216 and 217. In other words, each of the transistors 216 and 217 here may be regarded as being constituted by a group of 8 parallel-connected transistors. Note that, for the sake of simplification, FIG. 8 omits illustrations of the source lines and FIGS. 9A and 9B omit illustrations of inter-layer insulating films.

Figure 9A:
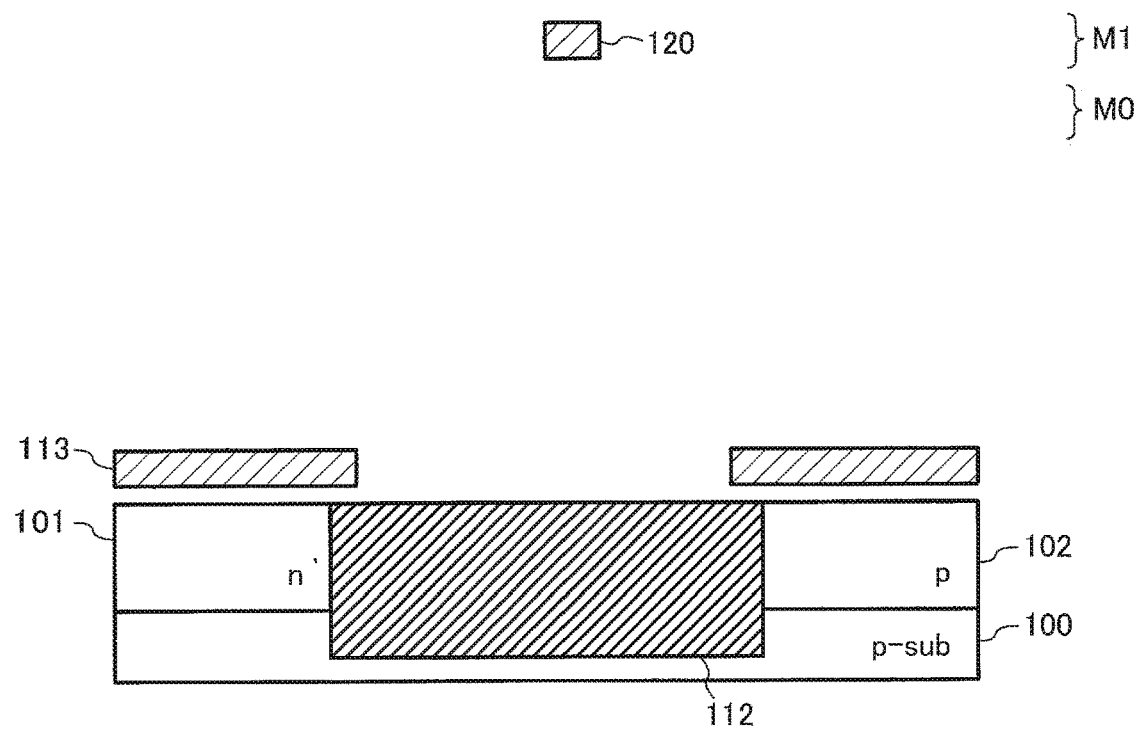
FIG. 9A is a sectional view taken along a line 9A-9A shown in FIG. 8.
Figure 9B:
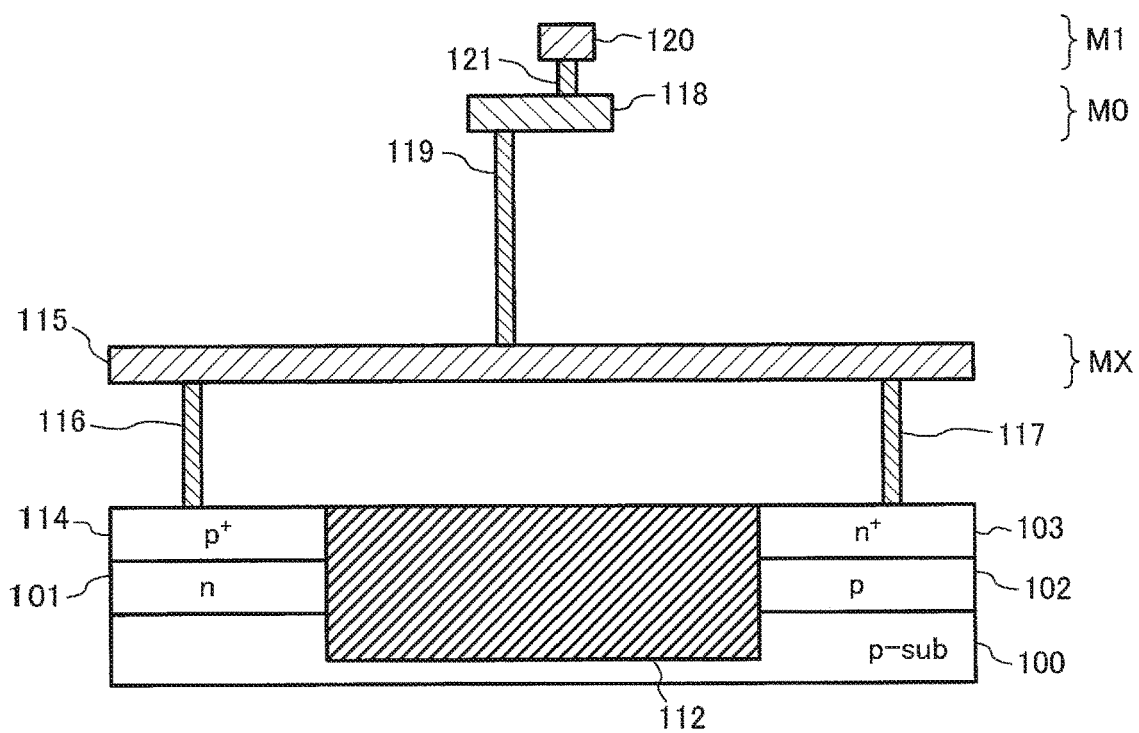
FIG. 9B is a sectional view taken along a line 9B-9B shown in FIG. 8.

As shown in FIG. 8 and FIGS. 9A and 9B, there is the p-type semiconductor substrate 100, and an n-type well 101 and a p-type well 102 here are provided along the first direction D1 and away from each other in the surface region of the semiconductor substrate 100. The wells 101 and 102 are each surrounded by an element separation region 112. The wells 101 and 102 are each provided with 8 conductive layers 113's (for example, polycrystalline silicon layers) above them, and these conductive layers 113's function as the gate electrodes for the respective one of the transistors 216 and 217. The 8 conductive layers 113's are formed above the semiconductor substrate 100 via gate insulating films (not illustrated), and extend in the first direction D1 across corresponding one of the n-type well 101 and the p-type well 102. The first direction D1 and the second direction D2 that is parallel to the semiconductor substrate 100 and perpendicular to the first direction D1 here are intended to be the same directions as the respective first direction D1 and second direction D2 indicated in FIG. 4, but they may be different from or opposite of the first direction D1 and the second direction D2 in FIG. 4.

A p+-type impurity diffusion layer 114, serving as a source/drain region of the p-channel MOS transistor 216, is formed in the n-type well 101 on both sides of each of the 8 conductive layer 113's in the second direction D2. Also, an n+-type diffusion layer 103, serving as a source/drain impurity region of the n-channel MOS transistor 217, is formed in the p-type well 102 on both sides of each of the 8 conductive layer 113's in the second direction D2. Above the semiconductor substrate 100 with such p+-type diffusion layers 114's serving as the source impurity regions of the p-channel MOS transistor 216 and with such n+-type diffusion layers 103's serving as the source impurity regions of the n-channel MOS transistor 217, 4 interconnect layers 115's each providing a common connection to the drains of the transistors 216 and 217 are arranged separately from one another in the second direction D2. These 4 interconnect layers 115's are provided above the semiconductor substrate 100 via inter-layer insulating films (not illustrated), and are formed as a metal interconnect layer MX below the previously described 3 metal interconnect layers M0, M1, and M2. The interconnect layer 115 is provided for every 2 consecutive conductive layers 113's, such that it extends in the first direction D1 between and in parallel with these 2 conductive layers 113's. That is, the interconnect layer 115 is disposed in every other location between the 8 conductive layers 113's.

The interconnect layers 115's are each electrically coupled to, via one or more first contact plugs 116's, the corresponding p+-type diffusion layer 114 serving as the drain impurity region of the p-channel MOS transistor 216. Further, the interconnect layers 115's are each electrically coupled to, via one or more second contact plugs 117's, the corresponding n+-type diffusion layer 103 serving as the drain impurity region of the n-channel MOS transistor 217.

At the locations corresponding to the metal interconnect layer M0 and between the n-type well 101 and the p-type well 102, interconnect layers 118's are provided above and in parallel with the respective interconnect layers 115's via inter-layer insulating films (not illustrated). The interconnect layers 118's each have a length shorter than the distance between the n-type well 101 and the p-type well 102. Each interconnect layer 118 is electrically coupled to the corresponding interconnect layer 115 via a third contact plug 119.

Further, at the location corresponding to the metal interconnect layer M1 and between the n-type well 101 and the p-type well 102, a single interconnect layer 120 serving as an output signal line is provided via inter-layer insulating films (not illustrated). The interconnect layer 120 is electrically coupled to each interconnect layer 118 via a fourth contact plug 121. This interconnect layer 120 extends in the second direction D2 for connection with the corresponding data line 200. Note that the data lines 200's are intended to be in the metal interconnect layer M2, so the interconnect layer 120 may be provided in the metal interconnect layer M2 instead of the metal interconnect layer M1.

While not illustrated in FIG. 8, power interconnect layers serving as power lines VDD's for the respective sources of the p-channel MOS transistor 216 are arranged separately from one another in the second direction D2 and above the semiconductor substrate 100 where the p+-type diffusion layers 114's serving as the source impurity regions of the p-channel MOS transistor 216 are formed. These power interconnect layers may be provided in the metal interconnect layer MX as the interconnect layers 115's, or in another metal interconnect layer such as the metal interconnect layer M0.

Also, while not illustrated in FIG. 8, the 8 conductive layers 113's as the gate electrodes above the n-type well 101 may all be coupled to one metal interconnect layer in an area, for example, over the element separation region 112 so that signals from the NAND circuit 214 are received through this metal interconnect layer. Similarly, the 8 conductive layers 113's as the gate electrodes above the p-type well 102 may all be coupled to one metal interconnect layer in an area, for example, over the element separation region 112 so that signals from the NOR circuit 215 are received through this metal interconnect layer.

Furthermore, while not illustrated in FIG. 8, power interconnect layers serving as power lines VSS's for the respective sources of the n-channel MOS transistor 217 are arranged separately from one another in the second direction D2 and above the semiconductor substrate 100 where the n+-type diffusion layers 103's serving as the source impurity regions of the n-channel MOS transistor 217 are formed. These power interconnect layers may also be provided in the metal interconnect layer MX as the interconnect layers 115's, or in another metal interconnect layer such as the metal interconnect layer M0.

According to the exemplary structure shown in FIG. 8, the fourth contact plug 121 is provided for each of the 4 interconnect layers 115's. Thus, as shown in the circuit diagram in the figure, all the 8 transistors constituting the p-channel MOS transistor 216, and all the 8 transistors constituting the n-channel MOS transistor 217 can be coupled to the interconnect layer 120, i.e., the data line 200.

Figure 10A:
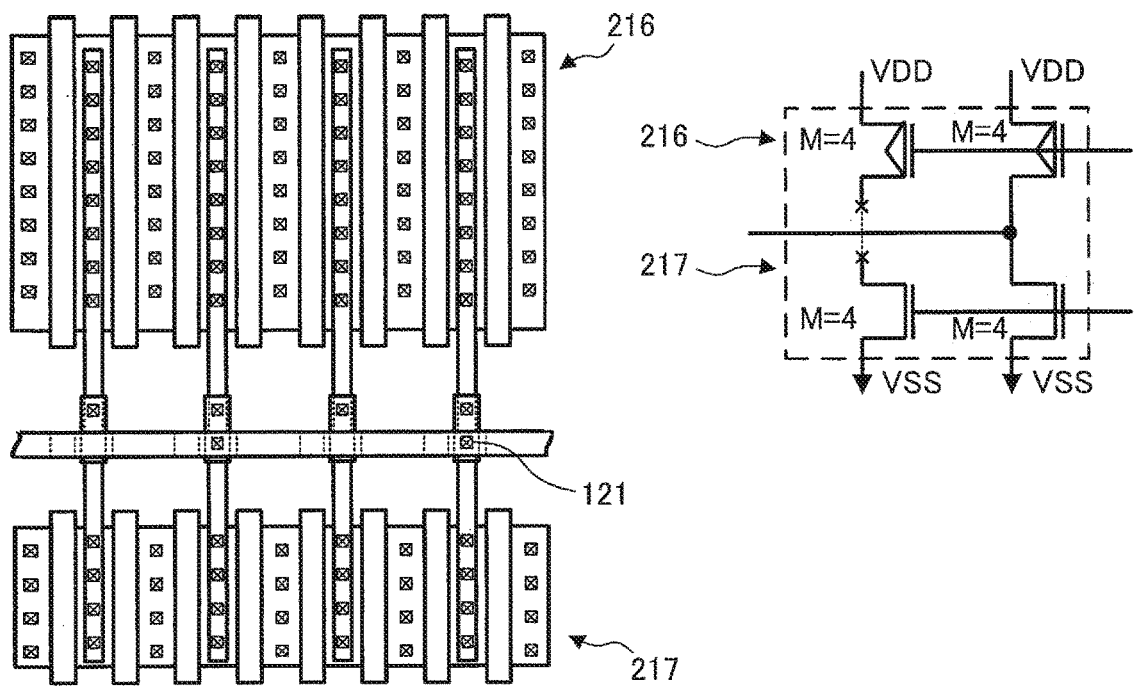
FIG. 10A and FIG. 10B each include a plan view and a circuit diagram showing other exemplary final stage transistors of the read-side repeater buffer in the flip flop-containing bidirectional repeater buffer circuit shown in FIG. 7.

Note that it is also possible to adopt a structure as shown in FIG. 10A, where only 2 of the 4 interconnect layers 115's are provided with their respective fourth contact plugs 121's for connection to the interconnect layer 120. With this structure, as shown in the circuit diagram in FIG. 10A, 4 transistors among the 8 parallel-connected transistors constituting the p-channel MOS transistor 216 are used validly, and the remaining 4 transistors are negated. 4 transistors among the 8 parallel-connected transistors constituting the n-channel MOS transistor 217 are used validly, and the remaining 4 transistors are negated. That is, in each of the p-channel MOS transistor 216 and the n-channel MOS transistor 217, only 4 transistors among the 8 constituent transistors can be coupled to the interconnect layer 120, i.e., the data line 200.

Figure 10B:
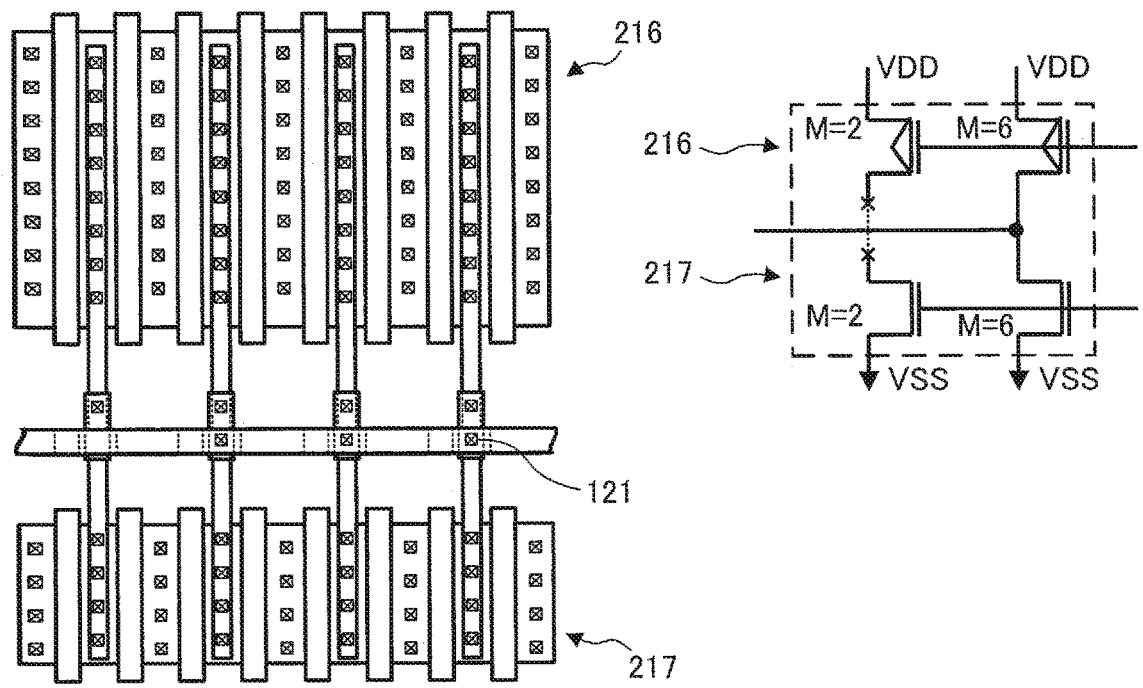

Moreover, it is possible to adopt a structure as shown in FIG. 10B, where only three of the 4 interconnect layers 115's are provided with their respective fourth contact plugs 121's for connection to the interconnect layer 120. With this structure, as shown in the circuit diagram in FIG. 10B, 6 transistors among the 8 parallel-connected transistors constituting the p-channel MOS transistor 216 are used validly, and the remaining 2 transistors are negated. 6 transistors among the 8 parallel-connected transistors constituting the n-channel MOS transistor 217 are used validly, and the remaining 2 transistors are negated. That is, in each of the p-channel MOS transistor 216 and the n-channel MOS transistor 217, only 6 transistors among the 8 constituent transistors can be coupled to the interconnect layer 120, i.e., the data line 200.

While no apparent drawings are given, it is of course possible to adopt a structure where only one of the 4 interconnect layers 115's is provided with the fourth contact plug 121. Accordingly, in each of the p-channel MOS transistor 216 and the n-channel MOS transistor 217, only 2 transistors among the 8 parallel-connected constituent transistors can be coupled to the interconnect layer 120, i.e., the data line 200.

Note that the number of transistors forming parallel connections within each of the p-channel MOS transistor 216 and the n-channel MOS transistor 217 is not limited to 8, but may be a fewer or greater number.

1.6 Concrete Examples of Data Signal Transmissions

Now, description will be given of concrete examples of the data signal transmissions performed with the foregoing configurations, etc.

Figure 11A:
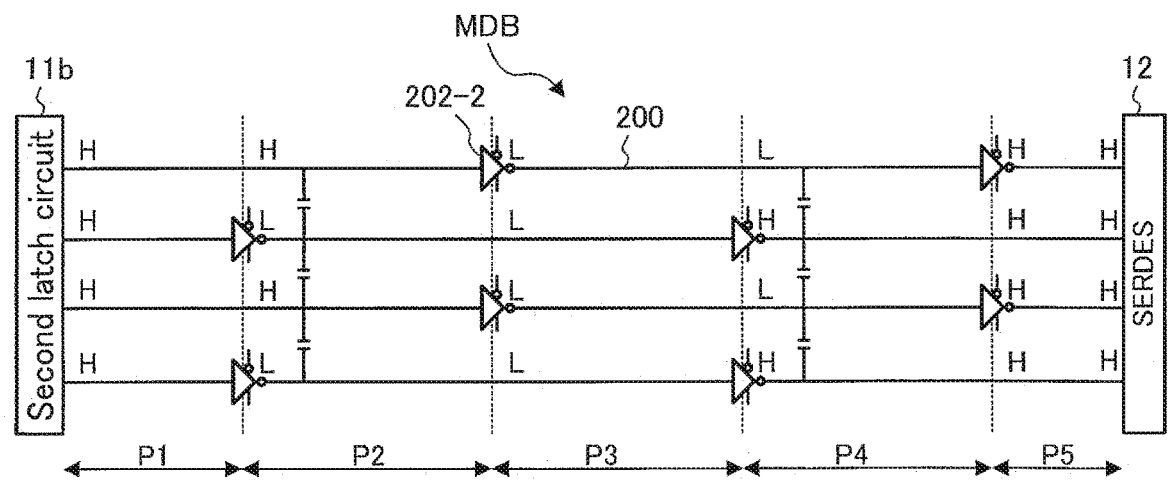
FIG. 11A is a diagram showing crosstalks due to the capacity between adjacent wires that occur when same-level data signals are conveyed through respective lines in the main data bus, where the repeater buffer circuits are arranged, in the semiconductor memory device according to the first embodiment.
Figure 11B:
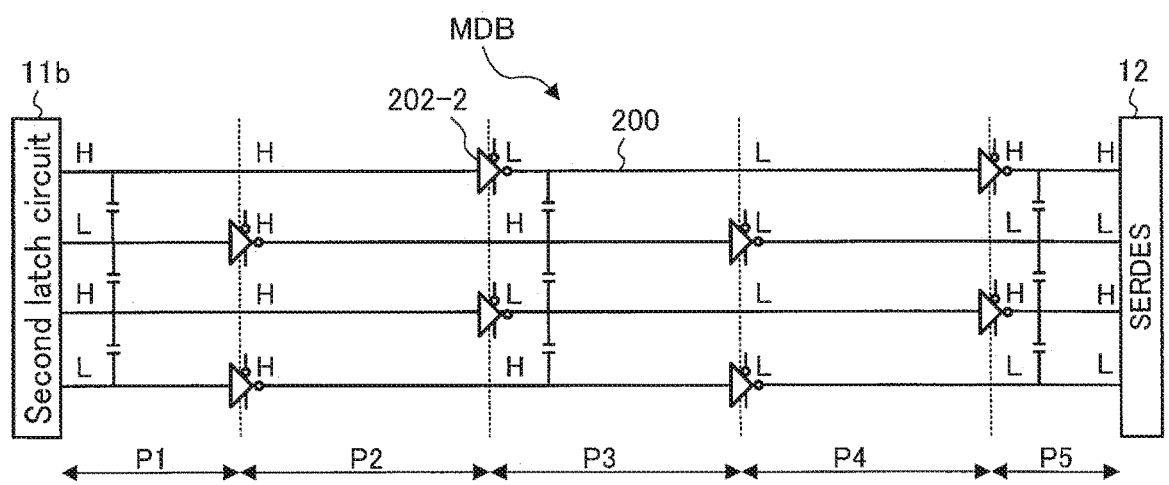
FIG. 11B is a diagram showing crosstalks due to the capacity between adjacent wires that occur when different-level data signals are conveyed through neighboring lines in the main data bus, where the repeater buffer circuits are arranged, in the semiconductor memory device according to the first embodiment.

FIGS. 11A and 11B each are a diagram for explaining transmissions of read data signals from the second latch circuit 11b to the serial/parallel conversion circuit 12 (indicated as "SERDES" in the figures). For the sake of explanation, the figures are simplified to show only 4 data lines 200's in the main data bus MDB, and the inverter-type repeater buffer 202-2 for use in data read operations as each of the repeater buffer circuits 19's. What are shown in these figures for the cases with 4 data lines 200's may be extended to the actual cases with the main data bus MDB including 80 data lines 200's, so the data signal transmissions to be performed in these cases may be similarly appreciated.

FIG. 11A assumes that all the read data signals given to the main data bus MDB via the second latch circuit 11b are of the same level (same phase). In this case, since the inverter-type repeater buffers 202-2's are each adapted to invert the data signal level, the main data bus MDB involves transmission sections where the neighboring data lines 200's will convey data signals differing in level from each other.

More specifically, same-level data signals are transmitted in: a section P1 ranging from the second latch circuit 11b to the point corresponding to one of the inverter-type repeater buffers 202-2's on each even-numbered data line 200; a section P3 ranging from the point corresponding to one of the inverter-type repeater buffers 202-2's on each odd-numbered data line 200 to the point corresponding to the other one of the inverter-type repeater buffers 202-2's on each even-numbered data line 200; and a section P5 ranging from the point corresponding to the other one of the inverter-type repeater buffers 202-2's on each odd-numbered data line 200 to the serial/parallel conversion circuit 12.

On the other hand, different-level data signals are transmitted in: a section P2 ranging from the point corresponding to one of the inverter-type repeater buffers 202-2's on each even-numbered data line 200 to the point corresponding to one of the inverter-type repeater buffers 202-2's on each odd-numbered data line 200; and a section P4 ranging from the point corresponding to the other one of the inverter-type repeater buffers 202-2's on each even-numbered data line 200 to the point corresponding to the other one of the inverter-type repeater buffers 202-2's on each odd-numbered data line 200. As shown in FIG. 11A, signal crosstalks due to the capacity between adjacent wires occur in these sections P2 and P4. In such a case of transmitting read data signals having one same phase, the possible maximum influence of the capacity between adjacent wires among the 4 data lines 200's can be reduced to 40% of that in the case where the inverter-type repeater buffers 202-2's arranged on the respective 4 data lines 200's to constitute one group are aligned along the direction orthogonal to the data lines 200's. The description will assume the capacity between adjacent wires to be the capacity between adjacent wires in the same interconnect layer.

FIG. 11B assumes that the read data signals given to the main data bus MDB via the second latch circuit 11b are of different levels (reversed phases) for respective data lines 200's. In also this case, as the inverter-type repeater buffers 202-2's are each adapted to invert the data signal level, the main data bus MDB involves transmission sections, i.e., the sections P1, P3, and P5, where the neighboring data lines 200's will convey data signals differing in level from each other, and where the signal crosstalks due to the capacity between adjacent wires will occur. In such a case of transmitting read data signals having reversed phases for the respective bits, the possible maximum influence of the capacity between adjacent wires among the 4 data lines 200's can be reduced to 60% of that in the case where the inverter-type repeater buffers 202-2's arranged on the respective 4 data lines 200's to constitute one group are aligned along the direction orthogonal to the data lines 200's.

Note that when the read data signals given to the main data bus MDB via the second latch circuit 11b contain a different-level signal for only one or two data lines 200's, the possible maximum influence of the capacity between adjacent wires among the 4 data lines 200's can be 40% to 60% of that in the case where the inverter-type repeater buffers 202-2's arranged on the respective 4 data lines 200's to constitute one group are aligned along the direction orthogonal to the data lines 200's.

1.7 Effects of First Embodiment

The configurations according to the first embodiment can realize semiconductor memory devices with enhanced reliability. Various aspects thereof will be described.

First, effects obtained by arranging the repeater buffer circuits 19's (inverter-type bidirectional repeater buffer circuits 201's) in a staggered pattern will be explained.

As the integration of components advances in semiconductor memory devices, such as the semiconductor memory device 1 presented herein, spaces that can be secured between long data lines in a main data bus, e.g., the data lines 200's running side by side for a long distance in the main data bus MDB, are becoming smaller. Nevertheless, the main data bus MDB is intended to have a large bus width, and inserting shield lines between the data lines 200's is not a practical solution in view of the available spaces and required costs. The neighboring data lines 200's as such, when transmitting respective different-level data signals, would cause signal crosstalks due to the capacity between adjacent wires, which can act as noise to deteriorate or delay the transmitted data signals. Thus, as compared to the data lines 200's conveying same-level data signals, the data lines 200's conveying different-level data signals can produce a large delay up to arrival of the data signals at the receiver side, and an increased data invalid period or deteriorated duty for the bus data signals may result. Consequently, the receiver side may have to use a narrowed data capture window, and may have to expect problems in accurate data exchange and high-speed data bus operations.

The size of the data capture window for importing read data in the serial/parallel conversion circuit 12 is determined based on the condition of experiencing the influence of the capacity between adjacent wires to the maximum extent and the condition of experiencing the influence to the minimum extent. FIG. 12A shows a data capture window according to a comparative example, where the repeater buffer circuits 19's on the neighboring data lines 200's are arranged at equivalent positions (side by side in the direction orthogonal to the direction along the data lines 200's). Note that FIG. 12A intends time along the horizontal axis and voltage along the vertical axis. Also in the figure, the broken lines indicate the condition of experiencing the influence of the capacity between adjacent wires to the maximum extent (100% in this comparative example), and the solid lines indicate the condition of experiencing the influence of the capacity between adjacent wires to the minimum extent (0% in this comparative example). As shown here, the data capture window according to the comparative example has a size W1 as a result of the deterioration or delay of the transmitted data signals due to the influence of the capacity between adjacent wires.

In contrast, FIG. 12B shows a data capture window that can be obtained at the serial/parallel conversion circuit 12 in the configurations according to the embodiment, where the repeater buffer circuits 19's on the neighboring data lines 200's are arranged in the staggered pattern. In the figure, the broken lines indicate the condition of experiencing the influence of the capacity between adjacent wires to the maximum extent (60% in the present embodiment), and the solid lines indicate the condition of experiencing the influence of the capacity between adjacent wires to the minimum extent (40% in the present embodiment). As discussed in above 1.6 with reference to the concrete examples of data signal transmissions, the present embodiment uniformizes the influence of the capacity between adjacent wires among the subject data lines 200's so that the influence of the capacity between adjacent wires can be 40% to 60% of that in the case where the repeater buffer circuits 19's arranged on the respective data lines 200's to constitute one group are aligned along the direction orthogonal to the data lines 200's, keeping the difference between the maximum extent and the minimum extent 20%. With such a reduced difference in extent of the influence of the capacity between adjacent wires, variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. Therefore, the data capture window according to the embodiment can have a size W2 larger than the size W1.

As described above, the present embodiment disposes 2 repeater buffer circuits 19's on each of the data lines 200's in such an arrangement that the 2 repeater buffer circuits 19's on one data line 200 and the 2 repeater buffer circuits 19's on the neighboring data line 200 are located at alternate positions; namely, the repeater buffer circuits 19's are arranged in a staggered pattern. With this arrangement, the embodiment can minimize the undesired influence by signal crosstalks. Accordingly, the embodiment can suppress signal deteriorations in semiconductor memory devices, including even a semiconductor memory device having a configuration for realizing a high-speed read and write ability and a large capacity by downsizing each plane for accelerated accesses, using a plurality of planes, and so on. The embodiment thus allows the serial/parallel conversion circuit 12 to secure a sufficient data capture window, so that erroneous read can be prevented. Therefore, the embodiment when applied to a semiconductor memory device can enhance the device's reliability.

Moreover, since the embodiment serves to prevent the data capture window from becoming narrower, the embodiment enables semiconductor memory devices to deal with higher frequency output signals (clock signals), i.e., have higher processing capabilities.

Next, effects obtained by adopting a transistor size according to a load on data bus lines will be explained. The transistor size here may refer to each of the size of the p-channel MOS transistor 216 and the size of the n-channel MOS transistor 217 that constitute the read-side repeater buffer 212-2 in each flip flop-containing bidirectional repeater buffer circuit 211 in the second latch circuit 11*b*.

As understood from FIGS. 1 and 5, the data lines 200's in the main data bus MDB between the second latch circuit 11*b* and the serial/parallel conversion circuit 12 may not always have an equal line length, and there can be variations in parasitic resistance and capacity of lines. In this relation, for the p-channel MOS transistor 216 and the n-channel MOS transistor 217 as shown in FIG. 8 in the repeater buffer 212-2 in each flip flop-containing bidirectional repeater buffer circuit 211 in the second latch circuit 11*b*, the number of effective constituent transistors, i.e., the transistor size, is selected according to the longest data bus line and therefore the largest load among the lines. In the p-channel MOS transistor 216 and the n-channel MOS transistor 217, the number of constituent transistors for valid use, that is, the transistor size, can be adjusted by changing the number of the fourth contact plugs 121's.

Accordingly, the present embodiment adjusts the transistor sizes of the p-channel MOS transistor 216 and the n-channel MOS transistor 217 in each repeater buffer 212-2, in accordance with the load on the corresponding data bus line so that the data signals transmitted via the data lines 200's in the main data bus MDB will have equal slopes. For example, for the p-channel MOS transistor 216 and the n-channel MOS transistor 217 which are connected to the data line 200 involving a large load, a large transistor size using all the 8 constituent transistors is selected so that the delay of the transmitted signals will be decreased and the transition speed (i.e. rising speed and falling speed of the signals) will be increased as shown by the broken lines in FIG. 12C. On the other hand, for the p-channel MOS transistor 216 and the n-channel MOS transistor 217 which are connected to the data line 200 involving a small load, a small transistor size using 4 of the 8 constituent transistors may be selected so that the delay of the transmitted signals will be increased and the transition speed will be decreased as shown by the solid lines in FIG. 12C. As a result, the data capture window according to the embodiment can have a size W3 even larger than the size W2. Thus, the embodiment allows the serial/parallel conversion circuit 12 to secure a sufficient data capture window, so that erroneous read can be prevented. Semiconductor memory devices adopting the embodiment can therefore further enhance the reliability.

Note that the data lines 200's in the main data bus MDB between the first latch circuit 11*a* and the serial/parallel conversion circuit 12 may involve variations in load, as well. The effects explained above can also be obtained here by selecting the transistor size according to the load on the corresponding data bus line, for the p-channel MOS transistor 216 and the n-channel MOS transistor 217 that constitute the read-side repeater buffer 212-2 in each flip flop-containing bidirectional repeater buffer circuit 211 in the first latch circuit 11*a*.

Also, the variations in load can similarly appear among the data lines 200's in the main data bus MDB for the respective portions from the repeater buffer circuits 19's (inverter-type bidirectional repeater buffer circuits 201's) arranged closer to the serial/parallel conversion circuit 12, that is, the respective final stages for data read, to the serial/parallel conversion circuit 12. As such, the p-channel MOS transistor 206 and the n-channel MOS transistor 207 constituting the read-side inverter-type repeater buffer 202-2 in each of these repeater buffer circuits 19's may be formed with the structures similar to those of the p-channel MOS transistor 216 and the n-channel MOS transistor 217 in the second latch circuit 11b, and their transistor sizes may be selected according to the load on the corresponding lines, so that further enhancing effects will be obtained.

Still more, in relation to the repeater buffer circuits 19's (inverter-type bidirectional repeater buffer circuits 201's), the variations in load can also appear among the data bus lines for the respective portions from the repeater buffer circuits 19's arranged closer to the second latch circuit 11b, that is, the respective final stages for data write, to the second latch circuit 11b. Thus, the p-channel MOS transistor 206 and the n-channel MOS transistor 207 constituting the write-side inverter-type repeater buffer 202-1 in each of these repeater buffer circuits 19's may also be formed with the structures as above, and their transistor sizes may be selected according to the load on the corresponding lines, so that the data signals transmitted through these data bus lines will have equal slopes.

1.8 Modification

The foregoing description of the first embodiment has assumed 2 neighboring data lines 200's to be a unit for the staggered-pattern arrangement of the repeater buffer circuits 19's (inverter-type bidirectional repeater buffer circuits 201's), but the arrangement may be based on a unit of 3 lines instead of 2 lines.

Figure 13A:
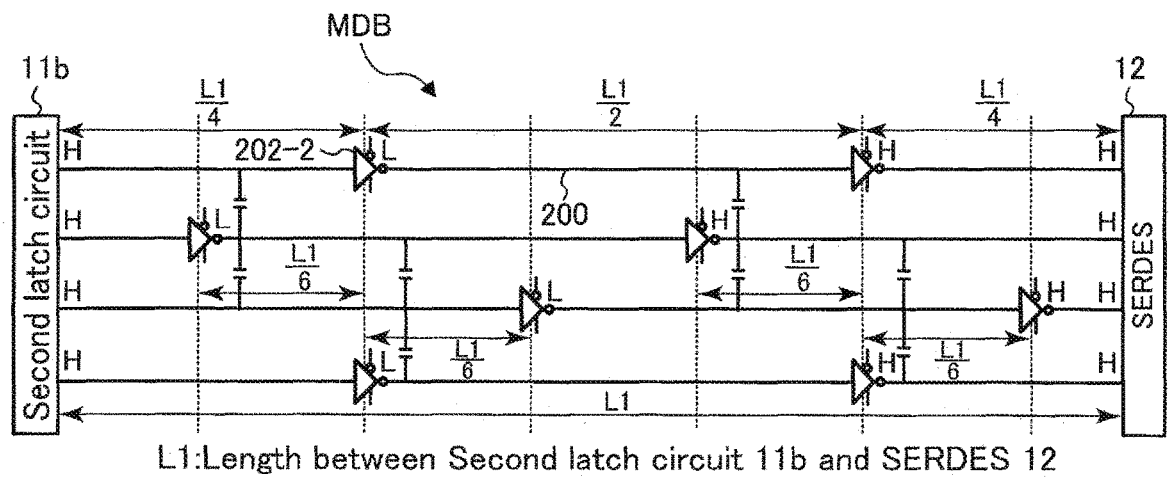
FIG. 13A is a diagram showing crosstalks due to the capacity between adjacent wires that occur when same-level data signals are conveyed through respective lines in a main data bus, where the repeater buffer circuits are arranged, in a semiconductor memory device according to a modification of the first embodiment.
Figure 13B:
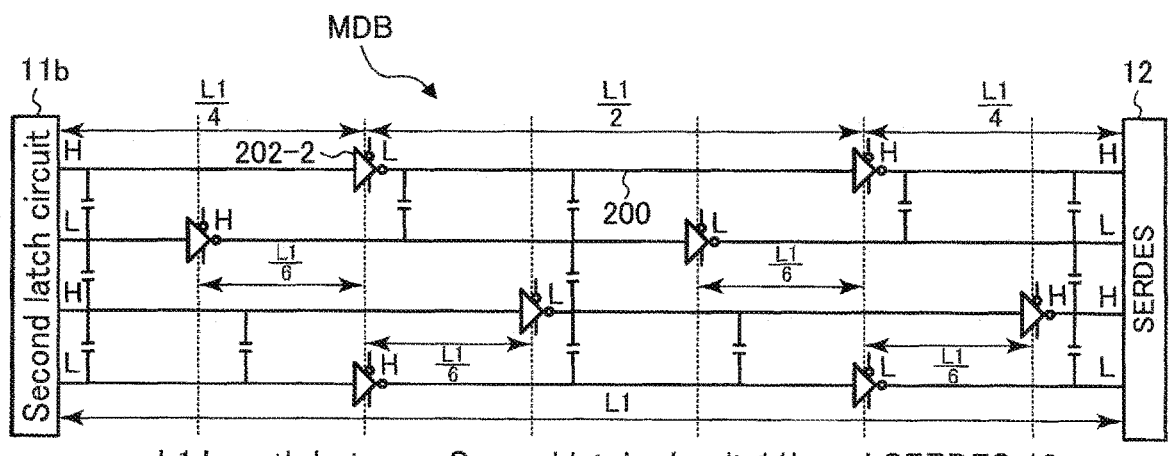
FIG. 13B is a diagram showing crosstalks due to the capacity between adjacent wires that occur when different-level data signals are conveyed through neighboring lines in the main data bus, where the repeater buffer circuits are arranged, in the semiconductor memory device according to the modification of the first embodiment.

FIGS. 13A and 13B give one example of such arrangements. For the sake of explanation, the figures are simplified to show only the read-side inverter-type repeater buffer 202-2 in each location of the repeater buffer circuit 19 (inverter-type bidirectional repeater buffer circuit 201). According to this example, one of the repeater buffer circuits 19's on each of the 1st, 4th, 7th, . . . data lines 200's is arranged at a position corresponding to approximately ¼ of the entire length of the data line 200 supposed to extend from the second latch circuit 11b to the serial/parallel conversion circuit 12. The other one of the repeater buffer circuits 19's on each of these data lines 200's is arranged at a position corresponding to approximately ¼ of the entire length of the data line 200 supposed to extend from the serial/parallel conversion circuit 12 to the second latch circuit 11b. The former repeater buffer circuits 19's are aligned in line along the direction orthogonal to the extending direction of the data lines 200's, and the latter repeater buffer circuits 19's are also aligned in line along the direction orthogonal to the extending direction of the data lines 200's. As such, the group of the former repeater buffer circuits 19's and the group of the latter repeater buffer circuits 19's are both orthogonal to the direction along the data lines 200's, while being in parallel with each other.

Meanwhile, on each of the 2nd, 5th, 8th, . . . data lines 200's, one of the 2 repeater buffer circuits 19's is arranged at a position between the group of the former repeater buffer circuits 19's on the 1st, 4th, 7th, . . . data lines 200's and the second latch circuit 11b, in the direction along the data lines 200's. More specifically, one of the 2 repeater buffer circuits 19's on each of the 2nd, 5th, 8th, . . . data lines 200's is arranged at a position corresponding to the position of the former repeater buffer circuit 19 on any of the 1st, 4th, 7th, . . . data lines 200's, which is supposed to have been shifted toward the second latch circuit 11b for a distance of as much as ⅓ of the length between the 2 repeater buffer circuits 19's on each of the 1st, 4th, 7th, . . . data lines 200's.

Also, the other one of the 2 repeater buffer circuits 19's on each of the 2nd, 5th, 8th, . . . data lines 200's is arranged at a position corresponding to the position of the latter repeater buffer circuit 19 on any of the 1st, 4th, 7th, . . . data lines 200's, which is supposed to have been shifted toward the second latch circuit 11b for a distance of as much as ⅓ of the length between the 2 repeater buffer circuits 19's on each of the 1st, 4th, 7th, . . . data lines 200's. Similar to the arrangement on the 1st, 4th, 7th, . . . data lines 200's, the group of the former repeater buffer circuits 19's and the group of the other, latter repeater buffer circuits 19's on the 2nd, 5th, 8th, . . . data lines 200's are both orthogonal to the direction along the data lines 200's, while being in parallel with each other.

On each of the 3rd, 6th, 9th, . . . data lines 200's, one of the 2 repeater buffer circuits 19's is arranged at a position corresponding to the position of the former repeater buffer circuit 19 on any of the 1st, 4th, 7th, . . . data lines 200's, which is supposed to have been shifted toward the serial/parallel conversion circuit 12 for a distance of as much as ⅓ of the length between the 2 repeater buffer circuits 19's on each of the 1st, 4th, 7th, . . . data lines 200's. Also, the other one of the 2 repeater buffer circuits 19's on each of the 3rd, 6th, 9th, . . . data lines 200's is arranged at a position corresponding to the position of the latter repeater buffer circuit 19 on any of the 1st, 4th, 7th, . . . data lines 200's, which is supposed to have been shifted toward the serial/parallel conversion circuit 12 for a distance of as much as ⅓ of the length between the 2 repeater buffer circuits 19's on each of the 1st, 4th, 7th, . . . data lines 200's. Similar to the arrangement on the 1st, 4th, 7th, . . . data lines 200's, the group of the former repeater buffer circuits 19's and the group of the other, latter repeater buffer circuits 19's on these 3rd, 6th, 9th, . . . data lines 200's are both orthogonal to the direction along the data lines 200's, while being in parallel with each other.

According to such a modified configuration, when all the read data signals given to the main data bus MDB via the second latch circuit 11b are of the same level (same phase) as shown in FIG. 13A, the possible maximum influence of the capacity between adjacent wires among the 4 data lines 200's can be reduced to 31% of that in the case where the repeater buffer circuits 19's arranged on the respective 4 data lines 200's to constitute one group are aligned along the direction orthogonal to the data lines 200's. On the other hand, when the read data signals given to the main data bus MDB via the second latch circuit 11b are of different levels (reversed phases) for respective data lines 200's as shown in FIG. 13B, the possible maximum influence of the capacity between adjacent wires among the 4 data lines 200's can be reduced to 44% of that in the case where the repeater buffer circuits 19's arranged on the respective 4 data lines 200's to constitute one group are aligned along the direction orthogonal to the data lines 200's.

Therefore, this modification also reduces the difference in extent of the influence of the capacity between adjacent wires, so that variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. The modification accordingly allows the serial/parallel conversion circuit 12 to secure a sufficient data capture window and can prevent erroneous read, as in the first embodiment. Semiconductor memory devices with enhanced reliability can thus be achieved by the modification.

2. Second Embodiment

A semiconductor memory device according to the second embodiment will be described. The second embodiment introduces, into the configurations of the first embodiment, additional repeater buffer circuits which are arranged at alternate positions on the neighboring data lines 200's. The remaining aspects of the second embodiment are basically the same as the first embodiment, so the description will mainly concentrate on the features differing from the first embodiment.

2.1 Configuration of Main Data Bus

Figure 14A:
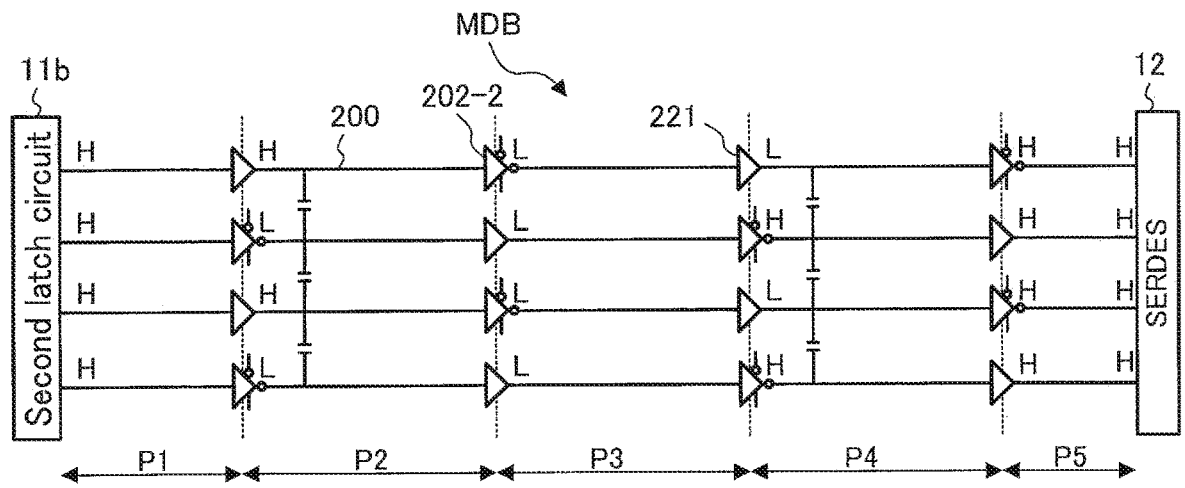
FIG. 14A is a diagram showing crosstalks due to the capacity between adjacent wires that occur when same-level data signals are conveyed through respective lines in a main data bus, where repeater buffer circuits are arranged, in a semiconductor memory device according to a second embodiment.
Figure 14B:
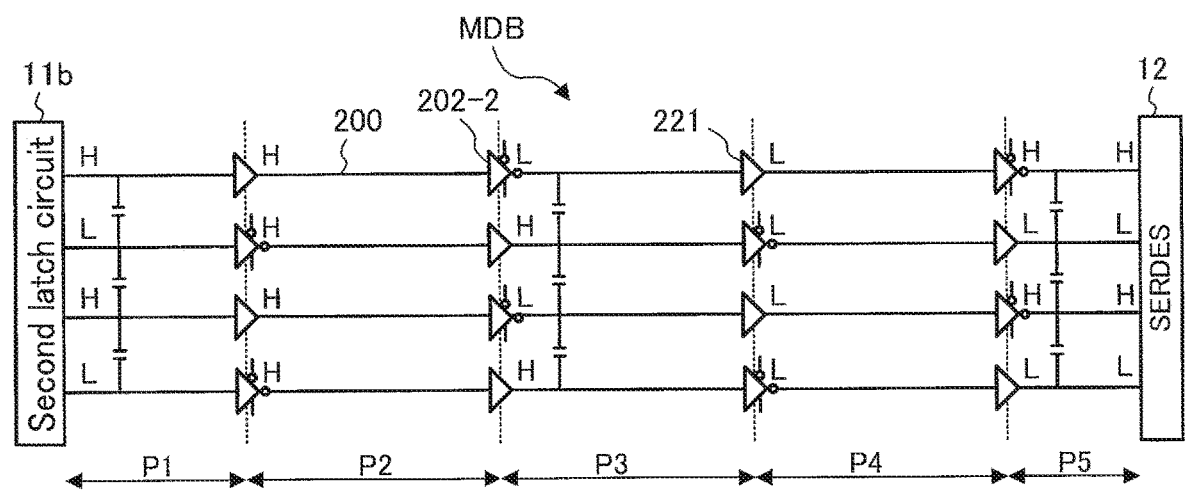
FIG. 14B is a diagram showing crosstalks due to the capacity between adjacent wires that occur when different-level data signals are conveyed through neighboring lines in the main data bus, where the repeater buffer circuits are arranged, in the semiconductor memory device according to the second embodiment.

FIGS. 14A and 14B each show positional relationships between additional repeater buffer circuits according to this embodiment, and the repeater buffer circuits 19's each being the inverter-type bidirectional repeater buffer circuit 201. For the sake of explanation, the figures are simplified to show only 4 data lines 200's in the main data bus MDB, and the inverter-type repeater buffer 202-2 for use in data read operations as each of the repeater buffer circuits 19's. What are shown in these figures for the cases with 4 data lines 200's may be extended to the actual cases with the main data bus MDB including 80 data lines 200's, so the data signal transmissions to be performed in these cases may be similarly appreciated.

The additional repeater buffer circuits discussed herein may each be a bidirectional repeater buffer circuit having a configuration of, for example, the repeater buffer circuit 19 as shown in FIG. 6, from which the inverters 203's are omitted. That is, such a bidirectional repeater buffer circuit includes a repeater buffer for use in data write operations and a repeater buffer for use in data read operations. Each of these repeater buffers includes an inverter constituted by a NAND circuit and a NOR circuit, and an inverter constituted by a p-channel MOS transistor and an n-channel MOS transistor. For simplification, in FIGS. 14A and 14B, only the repeater buffer for use in data read operations, which is denoted as 221, among the 2 repeater buffers is shown in each location of the additional repeater buffer circuit.

According to this embodiment, the additional repeater buffer circuits (repeater buffers 221's) on one data line 200 are arranged at positions corresponding to the 2 repeater buffer circuits 19's on the neighboring data line 200, respectively. That is, the 2 additional repeater buffer circuits on any odd-numbered data line 200 are aligned with the respective, corresponding 2 repeater buffer circuits 19's on any even-numbered data line 200 in the direction orthogonal to the direction along the data lines 200's, so that the groups of these aligned circuits are parallel with each other. Similarly, the 2 additional repeater buffer circuits on any even-numbered data line 200 are aligned with the respective, corresponding 2 repeater buffer circuits 19's on any odd-numbered data line 200 in the direction orthogonal to the direction along the data lines 200's, so that the groups of these aligned circuits are parallel with each other. To put it another way, the main data bus MDB according to this embodiment may include 80 data lines 200's, constituted by 40 data lines 200's each having 2 pairs of the sequentially arranged repeater buffer circuit 19 (inverter-type bidirectional repeater buffer circuit 201) and additional repeater buffer circuit (bidirectional repeater buffer circuit), and 40 data lines 200's each having 2 pairs of the sequentially arranged additional repeater buffer circuit (bidirectional repeater buffer circuit) and repeater buffer circuit 19 (inverter-type bidirectional repeater buffer circuit 201), where these different types of the data lines 200's are alternately provided one by one.

2.2 Concrete Examples of Data Signal Transmissions

FIG. 14A assumes that all the read data signals transmitted from the second latch circuit 11b to the serial/parallel conversion circuit 12 via the main data bus MDB are of the same level (same phase). Here, the data signal level is not inverted at each repeater buffer 221, but inverted only at each inverter-type repeater buffer 202-2. As such, as in the case discussed for the first embodiment, the main data bus MDB involves transmission sections, i.e., the sections P2 and P4, where the neighboring data lines 200's will convey data signals differing in level from each other. As shown in FIG. 14A, signal crosstalks due to the capacity between adjacent wires occur in these sections P2 and P4. In such a case of transmitting read data signals having one same phase, the possible maximum influence of the capacity between adjacent wires among the 4 data lines 200's can be reduced to 40% of that in the case where the inverter-type repeater buffers 202-2's arranged on the respective 4 data lines 200's to constitute one group are aligned along the direction orthogonal to the data lines 200's, as in the case of the first embodiment.

FIG. 14B assumes that the read data signals given to the main data bus MDB are of different levels (reversed phases) for respective data lines 200's. In also this case, the data signal level is not inverted at each repeater buffer 221, but inverted at each inverter-type repeater buffer 202-2, so that the main data bus MDB involves transmission sections, i.e., the sections P1, P3, and P5, where the neighboring data lines 200's will convey data signals differing in level from each other, and where the signal crosstalks due to the capacity between adjacent wires will occur. In such a case of transmitting read data signals having reversed phases for the respective bits, the possible maximum influence of the capacity between adjacent wires among the 4 data lines 200's can be reduced to 60% of that in the case where the inverter-type repeater buffers 202-2's arranged on the respective 4 data lines 200's to constitute one group are aligned along the direction orthogonal to the data lines 200's, as in the case of the first embodiment.

Note that when the read data signals given to the main data bus MDB via the second latch circuit 11b contain a different-level signal for only one or two data lines 200's, the possible maximum influence of the capacity between adjacent wires among the 4 data lines 200's can be 40% to 60% of that in the case where the inverter-type repeater buffers 202-2's arranged on the respective 4 data lines 200's to constitute one group are aligned along the direction orthogonal to the data lines 200's.

2.3 Effects of Second Embodiment

With the foregoing configuration, this embodiment also reduces the difference in extent of the influence of the capacity between adjacent wires, as in the first embodiment. Therefore, variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. The second embodiment accordingly allows the serial/parallel conversion circuit 12 to secure a sufficient data capture window and can prevent erroneous read, as in the first embodiment. Semiconductor memory devices with enhanced reliability can thus be achieved.

Moreover, according to this embodiment, the odd-numbered data lines 200's and the even-numbered data lines 200's can have an equal line length, that is, load on lines, for the portions between the respective repeater buffer circuits (between the repeater buffers 202-2 and 221).

As a matter of course, the transistor size to adopt in each repeater buffer may be adjusted according to the load on the corresponding line in the same manner as in the first embodiment, so that the same effects as described for the first embodiment can be obtained.

Additionally, in each of the repeater buffer circuits 19's (inverter-type bidirectional repeater buffer circuits 201's), the write-side inverter-type repeater buffer 202-1 and the read-side inverter-type repeater buffer 202-2 may each be constituted by 3 inverters as shown in FIG. 6. In each of the additional repeater buffer circuits (bidirectional repeater buffer circuits), the write-side and read-side repeater buffers 221's may each be constituted by 2 inverters as discussed above. When, as in this case, the number of inverter stages differs between the inverter-type repeater buffer 202-2 and the repeater buffer 221 which are arranged at substantially equal positions on the respective neighboring data lines 200's in the direction orthogonal to the direction along the data lines 200's, the neighboring data lines 200's can cause phase shifting. To address this issue, the transistor size of each transistor constituting the final inverter stage in the inverter-type repeater buffer 202-2 or the repeater buffer 221 may be adjusted to compensate for the difference in number of inverter stages. The phase shifting that can occur between the neighboring data lines 200's can be thereby suppressed.

2.4 Modification 2.4.1 First Modification

First, FIGS. 15A and 15B will be referred to for describing the first modification of the second embodiment.

According also to this modification, as in the modification of the first embodiment, 3 consecutive data lines 200's may be used as a unit for arranging the repeater buffer circuits 19's (inverter-type bidirectional repeater buffer circuits 201's) and the additional repeater buffer circuits (bidirectional repeater buffer circuits) as shown in FIGS. 15A and 15B. Note that FIGS. 15A and 15B are simplified to show only the read-side inverter-type repeater buffer 202-2 in each location of the repeater buffer circuit 19 (inverter-type bidirectional repeater buffer circuit 201) and only the read-side repeater buffer 221 in each location of the additional repeater buffer circuit (bidirectional repeater buffer circuit).

According to such a modified configuration, when all the read data signals given to the main data bus MDB via the second latch circuit 11b are of the same level (same phase) as shown in FIG. 15A, the possible maximum influence of the capacity between adjacent wires among the 4 data lines 200's can be reduced to 41% of that in the case where the inverter-type repeater buffers 202-2's arranged on the respective 4 data lines 200's to constitute one group are aligned along the direction orthogonal to the data lines 200's. On the other hand, when the read data signals given to the main data bus MDB via the second latch circuit 11b are of different levels (reversed phases) for respective data lines 200's as shown in FIG. 15B, the possible maximum influence of the capacity between adjacent wires among the 4 data lines 200's can be reduced to 59% of that in the case where the inverter-type repeater buffers 202-2's arranged on the respective 4 data lines 200's to constitute one group are aligned along the direction orthogonal to the data lines 200's.

Therefore, this first modification of the second embodiment also reduces the difference in extent of the influence of the capacity between adjacent wires, so that variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. The first modification accordingly allows the serial/parallel conversion circuit 12 to secure a sufficient data capture window, so that erroneous read can be prevented.

Semiconductor memory devices with enhanced reliability can thus be achieved.

2.4.2 Second Modification

Figure 16A:
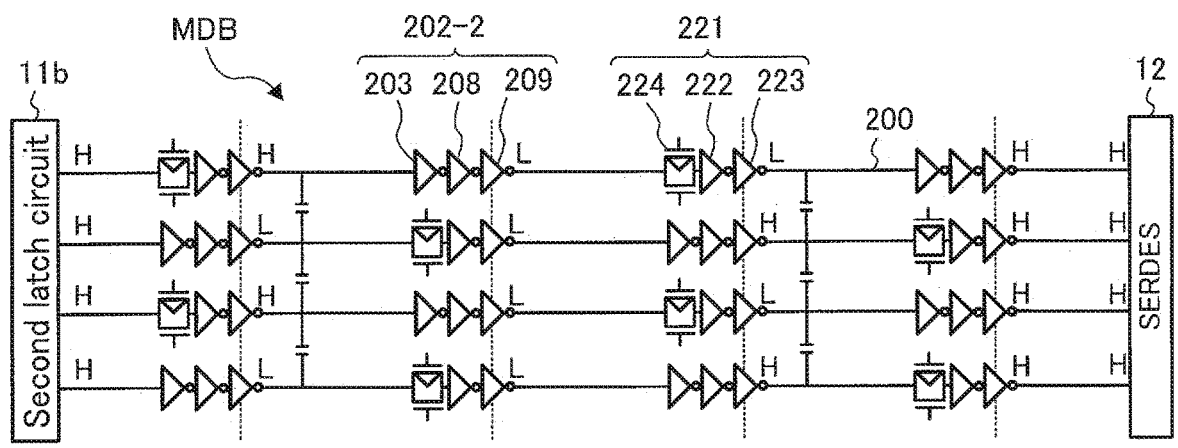
FIG. 16A is a diagram showing crosstalks due to the capacity between adjacent wires that occur when same-level data signals are conveyed through respective lines in a main data bus, where repeater buffer circuits are arranged, in a semiconductor memory device according to a second modification of the second embodiment.
Figure 16B:
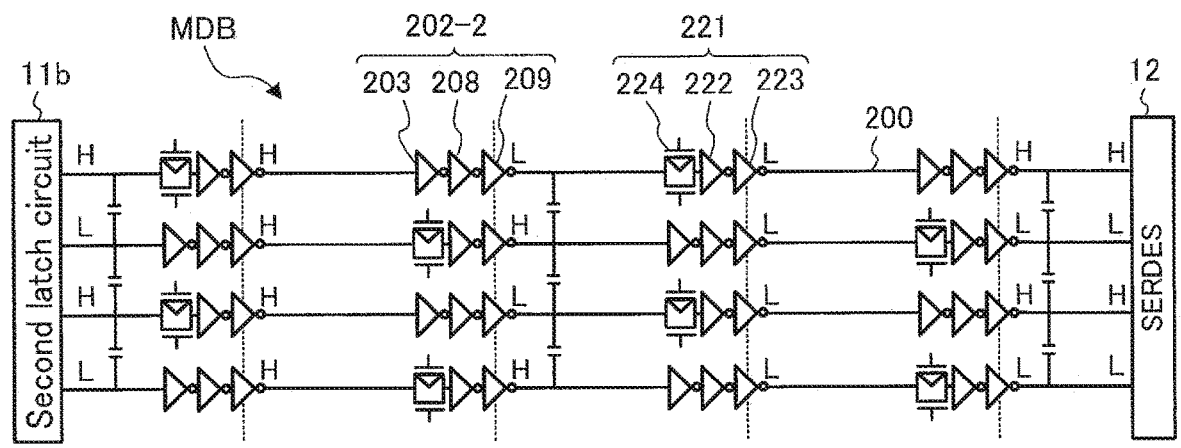
FIG. 16B is a diagram showing crosstalks due to the capacity between adjacent wires that occur when different-level data signals are conveyed through neighboring lines in the main data bus, where the repeater buffer circuits are arranged, in the semiconductor memory device according to the second modification of the second embodiment.

Next, FIGS. 16A and 16B will be referred to for describing the second modification of the second embodiment.

According to the second embodiment above, on each of the data lines 200's in the main data bus MDB the difference in number of inverter stages between the repeater buffer circuit 19 (inverter-type bidirectional repeater buffer circuit 201) and the additional repeater buffer circuit (bidirectional repeater buffer circuit) can be compensated for by means of the driver size. Instead of changing the driver size as discussed, it is also possible to add a transmission gate to each of the additional repeater buffer circuits so that the difference in number of inverter stages can be compensated for.

As shown in FIGS. 16A and 16B, each inverter-type repeater buffer 202-2 includes the inverter 203, the inverter 208 constituted by the NAND circuit 204 and the NOR circuit 205, and the inverter 209 constituted by the p-channel MOS transistor 206 and the n-channel MOS transistor 207. Also, the repeater buffer 221 in each additional repeater buffer according to the second embodiment includes an inverter 222 constituted by the NAND circuit and the NOR circuit, and an inverter 223 constituted by the p-channel MOS transistor and the n-channel MOS transistor. According to this second modification, each repeater buffer 221 further includes a transmission gate 224 as a stage before the inverter 222. The transmission gate 224 may discretionarily be disposed as a stage after the inverter 223.

With this configuration, when all the read data signals given to the main data bus MDB via the second latch circuit 11b are of the same level (same phase) as shown in FIG. 16A, the possible maximum influence of the capacity between adjacent wires among the 4 data lines 200's can be reduced to 40% of that in the case where the inverter-type repeater buffers 202-2's arranged on the respective 4 data lines 200's to constitute one group are aligned along the direction orthogonal to the data lines 200's, as in the cases of the first and second embodiments. When the read data signals given to the main data bus MDB via the second latch circuit 11b are of different levels (reversed phases) for respective data lines 200's as shown in FIG. 16B, the possible maximum influence of the capacity between adjacent wires among the 4 data lines 200's can be reduced to 60% of that in the case where the inverter-type repeater buffers 202-2's arranged on the respective 4 data lines 200's to constitute one group are aligned along the direction orthogonal to the data lines 200's, as in the cases of the first and second embodiments.

Therefore, this second modification of the second embodiment also reduces the difference in extent of the influence of the capacity between adjacent wires, so that variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. The second modification accordingly allows the serial/parallel conversion circuit 12 to secure a sufficient data capture window, so that erroneous read can be prevented. Semiconductor memory devices with enhanced reliability can thus be achieved.

2.4.3 Third Modification

Next, FIGS. 17A and 17B will be referred to for describing the third modification of the second embodiment.

In order to compensate for the difference in number of inverter stages between the repeater buffer circuit 19 (inverter-type bidirectional repeater buffer circuit 201) and the additional repeater buffer circuit (bidirectional repeater buffer circuit), this modification adjusts the length of the line between the repeater buffer circuit 19 and the additional repeater buffer circuit, instead of adjusting the driver size.

More specifically, as shown in FIGS. 17A and 17B, the positions to provide the repeater buffer circuits 19's and the additional repeater buffer circuits are modified so that, in each applicable case, the line is shortened between the inverter-type repeater buffer 202-2 in each repeater buffer circuit 19 (inverter-type bidirectional repeater buffer circuit 201) and the repeater buffer 221 in the additional repeater buffer circuit (bidirectional repeater buffer circuit) located next and on the right as viewed in the figures, while the line is lengthened between the repeater buffer 221 and the inverter-type repeater buffer 202-2 located next and on the right as viewed in the figures. According to such a modified configuration, when all the read data signals given to the main data bus MDB via the second latch circuit 11b are of the same level (same phase) as shown in FIG. 17A, the possible maximum influence of the capacity between adjacent wires among the 4 data lines 200's can be reduced to 58% of that in the case where the inverter-type repeater buffers 202-2's arranged on the respective 4 data lines 200's to constitute one group are aligned along the direction orthogonal to the data lines 200's. Also, when the read data signals given to the main data bus MDB via the second latch circuit 11b are of different levels (reversed phases) for respective data lines 200's as shown in FIG. 17B, the possible maximum influence of the capacity between adjacent wires among the 4 data lines 200's can be reduced to 43% of that in the case where the inverter-type repeater buffers 202-2's arranged on the respective 4 data lines 200's to constitute one group are aligned along the direction orthogonal to the data lines 200's.

Therefore, this third modification of the second embodiment also reduces the difference in extent of the influence of the capacity between adjacent wires, so that variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. The third modification accordingly allows the serial/parallel conversion circuit 12 to secure a sufficient data capture window, so that erroneous read can be prevented. Semiconductor memory devices with enhanced reliability can thus be achieved.

3. Third Embodiment

A semiconductor memory device according to the third embodiment will be described. This third embodiment arranges repeater buffer circuits 19's, each being the inverter-type bidirectional repeater buffer circuit 201 as in the first embodiment, on the data lines 200's in multiple, parallel alignments extending in the direction orthogonal to the direction along the data lines 200's, while forming each data line 200 in such a manner as to cross over one or more other data lines 200's in the main data bus MDB. That is, the arrangement of the neighboring repeater buffer circuits among the data lines 200's is modified from the first and second embodiments. The remaining aspects of the third embodiment are basically the same as the first embodiment, so the description will mainly concentrate on the features differing from the first embodiment.

3.1 Configuration of Main Data Bus

Figure 18A:
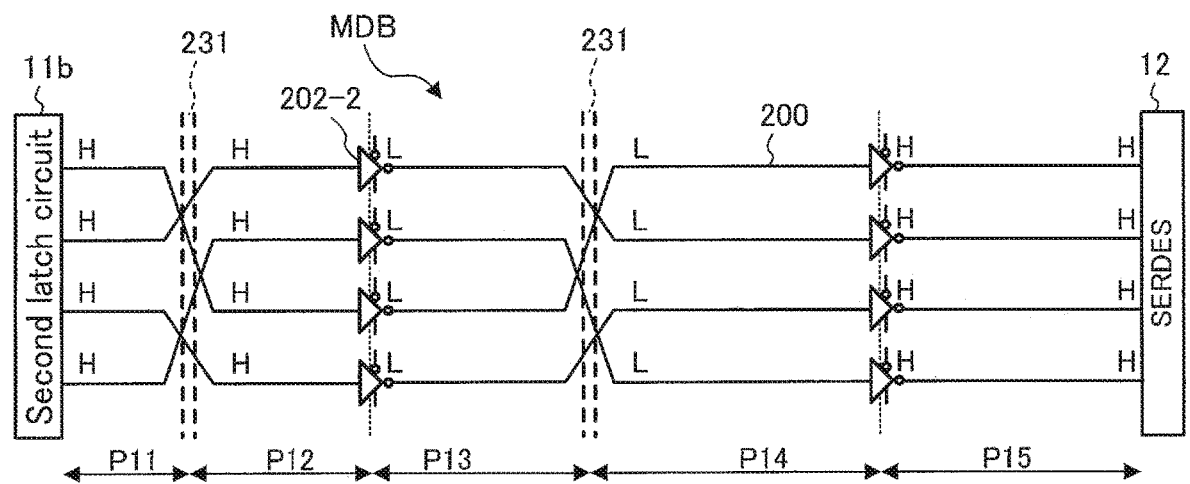
FIG. 18A is a diagram showing crosstalks due to the capacity between adjacent wires that occur when same-level data signals are conveyed through respective lines in a main data bus, where repeater buffer circuits are arranged, in a semiconductor memory device according to a third embodiment.
Figure 18B:
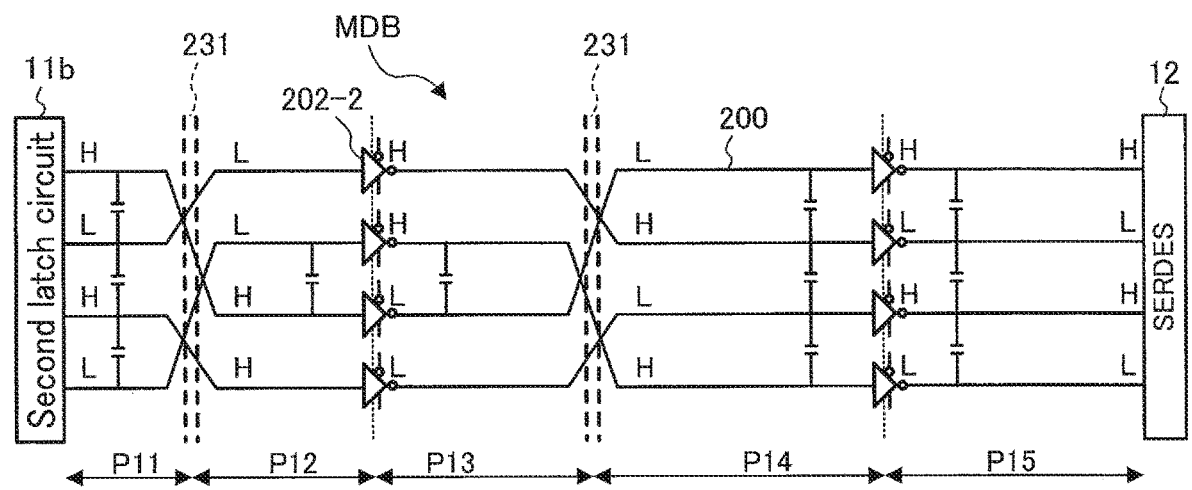
FIG. 18B is a diagram showing crosstalks due to the capacity between adjacent wires that occur when different-level data signals are conveyed through neighboring lines in the main data bus, where the repeater buffer circuits are arranged, in the semiconductor memory device according to the third embodiment.

FIGS. 18A and 18B are diagrams simplified for explanation, and each show only 4 data lines 200's in the main data bus MDB, and the inverter-type repeater buffer 202-2 for use in data read operations as each of the repeater buffer circuits 19's. What are shown in these figures for the cases with 4 data lines 200's may be extended to the actual cases with the main data bus MDB including 80 data lines 200's, so the data signal transmissions to be performed in these cases may be similarly appreciated.

According to this embodiment as shown in FIGS. 18A and 18B, one (first-stage) and the other (second-stage) repeater buffer circuits 19's on one data line 200 in the main data bus MDB are aligned with the respective, corresponding first-stage and the second-stage repeater buffer circuits 19's on any other data line 200 in the direction orthogonal to the direction along the data lines 200's, so that the group of the first-stage circuits and the group of the second-stage circuits are parallel with each other. In other words, the group of the first-stage repeater buffer circuits 19's on the data lines 200's and the group of the second-stage repeater buffer circuits 19's on the data lines 200's are aligned along the respective virtual axes that each extend in the direction orthogonal to the direction along the data lines 200's.

Each data line 200 may cross over one or more other data lines 200's in the space between the second latch circuit 11b and the own first-stage repeater buffer circuit 19, and also in the space between the own first-stage repeater buffer circuit 19 and the own second-stage repeater buffer circuit 19. More specifically, it may be understood here that there are a first region (section P11), a second region, and a third region (section P12) in the data lines 200's for the portion between the second latch circuit 11b and the group of the first-stage repeater buffer circuits 19's. Among the regions in this portion of the data lines 200's, the first region is the closest to the second latch circuit 11b. The third region is the closest to the serial/parallel conversion circuit 12. Between the first region and the third region is the second region. According to this understanding, 3 consecutive data lines 200's are parallel to one another in the first region, and 3 consecutive data lines 200's in the third region are also parallel to one another but may be in a different order or replaced by different data lines 200's. In the second region, at least 2 of the data lines 200's cross over each other.

The data lines 200's, for the portion between the group of the first-stage repeater buffer circuits 19's and the group of the second-stage repeater buffer circuits 19's, may be similarly provided. That is, this portion of the data lines 200's may also include a first region (section P13), a third region (section P14), and a second region between the first region and the third region. Each first-stage repeater buffer circuit 19 (including the inverter-type repeater buffer 202-2) is disposed between the sections P12 and P13, and each second-stage repeater buffer circuit 19 (including the inverter-type repeater buffer 202-2) is disposed between the sections P14 and P15). In the second region, at least 2 of the 3 consecutive data lines 200's cross over each other.

In light of the typically adopted structures, the data lines 200's are formed in, for example, the metal interconnect layer M2 above the semiconductor substrate 100. The metal interconnect layer M2 includes, for example, the interconnect layer 111 functioning as the source line SL for the planes PLN's in the core part 2, various signal lines for control signals, clock signals, etc. from the chip control circuit 13 to the core part 2, and power lines. While FIG. 1 shows that the signal lines for control signals and clock signals detour around the main data bus MDB and the first and second latch circuits 11a and 11b, these signal lines may in practice be provided across the data lines 200's constituting the main data bus MDB as shown in FIGS. 18A and 18B, where the signal lines are each indicated by broken lines and denoted as 231. As such, the data lines 200's in this case may be formed using the metal interconnect layer M1 or M0 below the metal interconnect layer M2, for the area of such crossover point with the line 231.

The third embodiment may utilize this crossover point between the data lines 200's and the line 231 for also the formation of the crossover of the data lines 200's themselves, so that no special or independent sinking structure for the data lines 200's needs to be newly formed for this purpose.

3.2 Concrete Examples of Data Signal Transmissions

FIG. 18A assumes that all the read data signals transmitted from the second latch circuit 11b to the serial/parallel conversion circuit 12 via the main data bus MDB are of the same level (same phase). Here, each repeater buffer circuit 19 (including the inverter-type repeater buffer 202-2) inverts the data signal level. However, the neighboring data lines 200's in this case do not involve a transmission section where data signals differing in level from each other will be transmitted.

The section P11 is a transmission section ranging from the second latch circuit 11b to one data-line crossover point that is between the second latch circuit 11b and the group of the first-stage repeater buffer circuits 19's, and the 4 data lines 200's in this section are parallel with each other. The section P12 is a transmission section ranging from said one data-line crossover point to the group of the first-stage repeater buffer circuits 19's, and the 4 data lines 200's are parallel with each other in also this section. The region between the sections P11 and P12 thus includes the one data-line crossover point. The section P13 is a transmission section ranging from the group of the first-stage repeater buffer circuits 19's to the other data-line crossover point that is between the group of the first-stage repeater buffer circuits 19's and the group of the second-stage repeater buffer circuits 19's, and the 4 data lines 200's in this section are also parallel with each other. The section P14 is a transmission section ranging from the other data-line crossover point to the group of the second-stage repeater buffer circuits 19's, and the 4 data lines 200's in this section are parallel with each other. The region between the sections P13 and P14 thus includes the other data-line crossover point. The section P15 is a transmission section ranging from the group of the second-stage repeater buffer circuits 19's to the serial/parallel conversion circuit 12. The neighboring data lines 200's convey the same-level data signals throughout the sections P11 to P15. Therefore, in such a case of transmitting read data signals having one same phase, the influence of the capacity between adjacent wires among the 4 data lines 200's can be 0%.

FIG. 18B assumes that the read data signals given to the main data bus MDB are of different levels (reversed phases) for respective data lines 200's. In this case, as the repeater buffer circuits 19's are each adapted to invert the data signal level, the main data bus MDB involves transmission sections, i.e., the sections P11 to P15, where the neighboring data lines 200's will convey data signals differing in level from each other, and where the signal crosstalks due to the capacity between adjacent wires will occur. Here, the signal crosstalks would occur in all the neighboring data lines 200's in the sections P11, P14, and P15, while the signal crosstalks would occur in only some of the neighboring data lines 200's in the sections P12 and P13. In such a case of transmitting read data signals having reversed phases for the respective bits, the possible maximum influence of the capacity between adjacent wires among the 4 data lines 200's can be reduced to 73% of that in the case where the inverter-type repeater buffers 202-2's arranged on the respective 4 data lines 200's to constitute one group are aligned along the direction orthogonal to the data lines 200's and the 4 data lines 200's do not cross over one another.

Note that when the read data signals given to the main data bus MDB via the second latch circuit 11b contain a different-level signal for only one or two data lines 200's, the possible maximum influence of the capacity between adjacent wires among the 4 data lines 200's can be 0% to 73% of that in the case where the inverter-type repeater buffers 202-2's arranged on the respective 4 data lines 200's to constitute one group are aligned along the direction orthogonal to the data lines 200's and the 4 data lines 200's do not cross over one another.

Supposing that the inverter-type repeater buffers 202-2's arranged on the respective data lines 200's to constitute one group are aligned along the direction orthogonal to the data lines 200's and the data lines 200's do not cross over one another, the influence of the capacity between adjacent wires among the data lines 200's can be 0% to 100%, giving a large difference between the minimum extent and the maximum extent. In contrast, the present embodiment introduces the mutual crossover of the data lines 200's to uniformize the influence of the capacity between adjacent wires among the subject data lines 200's, so that the influence of the capacity between adjacent wires can be 0% to 73% of that in the case where the inverter-type repeater buffers 202-2's arranged on the respective data lines 200's to constitute one group are aligned along the direction orthogonal to the data lines 200's and the data lines 200's do not cross over one another. Accordingly, the difference between the maximum extent and the minimum extent can be reduced to 73%, while the case without the crossover of the data lines 200's must deal with the 100% difference.

3.3 Effects of Third Embodiment

With the foregoing configuration, this embodiment also reduces the difference in extent of the influence of the capacity between adjacent wires, as in the first embodiment.

Therefore, variations in degree of deterioration and delay of the transmitted data signals are suppressed. Specifically, the data lines 200's conveying reversed-phase data signals and the data lines 200's conveying same-phase data signals can deliver their respective data signals to the receiver side with a reduced difference in delay time. The third embodiment accordingly allows the serial/parallel conversion circuit 12 to secure a sufficient data capture window and can prevent erroneous read, as in the first embodiment. Semiconductor memory devices with enhanced reliability can thus be achieved. Note that the configuration of this embodiment requires the crossover of 3 or more data lines 200's.

As a matter of course, the transistor size to adopt in each repeater buffer may be adjusted according to the load on the corresponding line in the same manner as in the first embodiment, so that the same effects as described for the first embodiment can be obtained.

4. Fourth Embodiment

Next, a semiconductor memory device according to the fourth embodiment will be described. This embodiment applies the mutual crossover of the data lines 200's in the main data bus MDB, as in the third embodiment, to the first embodiment or the second embodiment. The remaining aspects of the embodiment are basically the same as the third embodiment, so the description will mainly concentrate on the features differing from the third embodiment.

4.1 Configuration of Main Data Bus

The crossover of the data lines 200's according to the third embodiment can be applied to each of the first and the second embodiments. Note that the difference between the first and the second embodiments is that the latter provides the additional repeater buffer circuits. The description will assume an instance where the crossover of the data lines 200's is applied to the second embodiment.

Figure 19A:
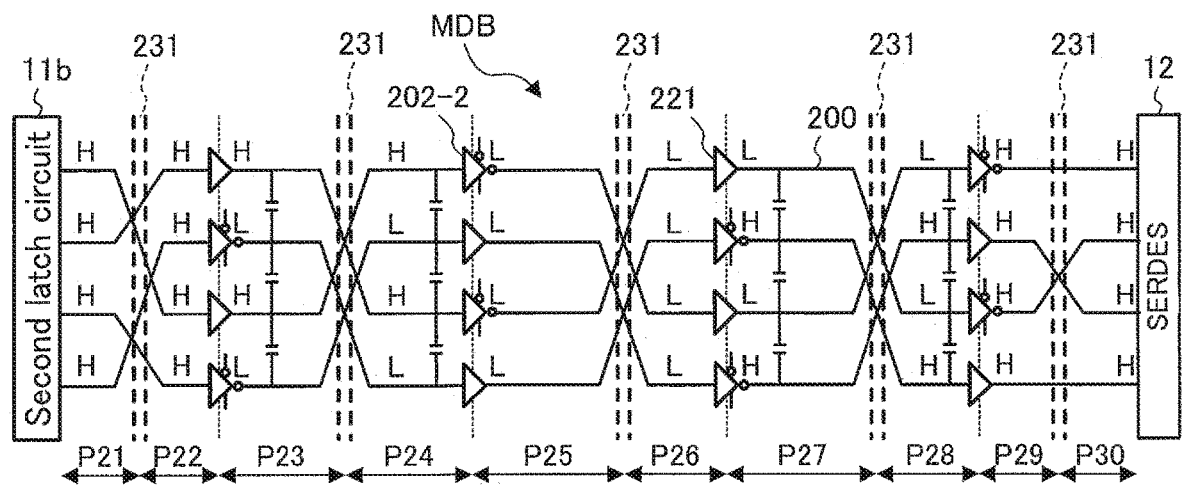
FIG. 19A is a diagram showing crosstalks due to the capacity between adjacent wires that occur when same-level data signals are conveyed through respective lines in a main data bus, where repeater buffer circuits are arranged, in a semiconductor memory device according to a fourth embodiment.
Figure 19B:
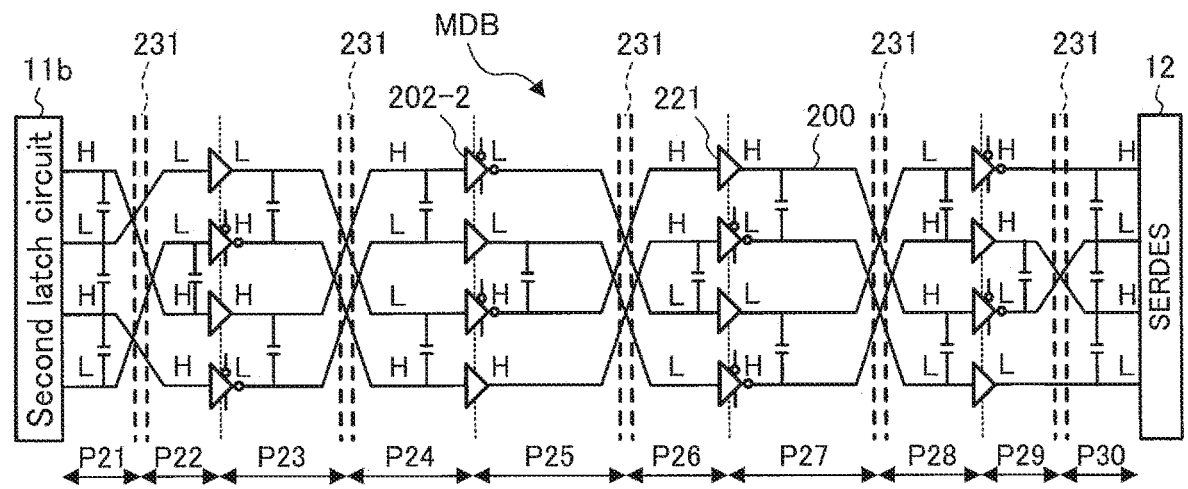
FIG. 19B is a diagram showing crosstalks due to the capacity between adjacent wires that occur when different-level data signals are conveyed through neighboring lines in the main data bus, where the repeater buffer circuits are arranged, in the semiconductor memory device according to the fourth embodiment.

FIGS. 19A and 19B are diagrams simplified for explanation, and each show only 4 data lines 200's in the main data bus MDB, and the inverter-type repeater buffer 202-2 and the repeater buffer 221 for use in data read operations as the respective repeater buffer circuit 19 and additional repeater buffer circuit. What are shown in these figures for the cases with 4 data lines 200's may be extended to the actual cases with the main data bus MDB including 80 data lines 200's, so the data signal transmissions to be performed in these cases may be similarly appreciated.

According to this embodiment where the repeater buffer circuits 19's (each including the inverter-type repeater buffer 202-2) and the additional repeater buffer circuits (each including the repeater buffer 221) are arranged in the manner similar to the second embodiment, the data lines 200's may cross over one another in spaces as shown in FIGS. 19A and 19B, namely, as viewed from the left to the right in the figures, the space before the group of the inverter-type repeater buffers 202-2's and the repeater buffers 221's for each stage, and also the space after the final stage group of the inverter-type repeater buffers 202-2's and the repeater buffers 221's. The space after the final stage group is for the 2nd and 3rd data lines 200's. More specifically, it may be understood here that there are a first region, a second region, and a third region in the data lines 200's for the portion between the second latch circuit 11b and the first-stage group of the repeater buffer circuits 19's and the additional repeater buffer circuits. The first region is the closest to the second latch circuit 11b, among the regions in this portion of the data lines 200's. The third region is the closest to the serial/parallel conversion circuit 12. Between the first region and the third region is the second region. According to this understanding, 3 consecutive data lines 200's are parallel to one another in the first region, and 3 consecutive data lines 200's in the third region are also parallel to one another but may be in a different order or replaced by different data lines 200's. In the second region, at least 2 of the data lines 200's cross over each other.

The data lines 200's are similarly provided for the portion from the i-th stage (i being an integer equal to or greater than 1) group of the repeater buffer circuits 19's and the additional repeater buffer circuits to the (i+1)-th stage group of the repeater buffer circuits 19's and the additional repeater buffer circuits, and for the portion from the final stage group of the repeater buffer circuits 19's and the additional repeater buffer circuits to the serial/parallel conversion circuit 12.

4.2 Concrete Examples of Data Signal Transmissions

FIG. 19A assumes that all the read data signals transmitted from the second latch circuit 11b to the serial/parallel conversion circuit 12 via the main data bus MDB are of the same level (same phase). In this case, the data signal level is not inverted at each repeater buffer 221, but inverted at each inverter-type repeater buffer 202-2. The main data bus MDB thus involves transmission sections where the neighboring data lines 200's will convey data signals differing in level from each other, and where the signal crosstalks due to the capacity between adjacent wires will occur.

In the exemplary case shown in the figures, there are transmission sections P21 to P30 between the second latch circuit 11b and the serial/parallel conversion circuit 12. The section P21 is a transmission section ranging from the second latch circuit 11b to the first data-line crossover point that is between the second latch circuit 11b and the first-stage group of the repeater buffer circuits 19's and the additional repeater buffer circuits, and the 4 data lines 200's in this section are parallel with each other. The section P22 is a transmission section ranging from the first data-line crossover point to the first-stage group of the repeater buffer circuits 19's and the additional repeater buffer circuits, and the 4 data lines 200's in this section are parallel with each other. The region between the sections P21 and P22 thus includes the first data-line crossover point. The section P23 is a transmission section ranging from the first-stage group of the repeater buffer circuits 19's and the additional repeater buffer circuits to the second data-line crossover point that is between the first-stage group of the repeater buffer circuits 19's and the additional repeater buffer circuits and the second-stage group of the repeater buffer circuits 19's and the additional repeater buffer circuits, and the 4 data lines 200's in this section are parallel with each other. The section P24 is a transmission section ranging from the second data-line crossover point to the second-stage group of the repeater buffer circuits 19's and the additional repeater buffer circuits, and the 4 data lines 200's in this section are parallel with each other. The region between the sections P23 and P24 thus includes the second data-line crossover point. The section P25 is a transmission section ranging from the second-stage group of the repeater buffer circuits 19's and the additional repeater buffer circuits to the third data-line crossover point that is between the second-stage group of the repeater buffer circuits 19's and the additional repeater buffer circuits and the third-stage group of the repeater buffer circuits 19's and the additional repeater buffer circuits, and the 4 data lines 200's in this section are parallel with each other. The section P26 is a transmission section ranging from the third data-line crossover point to the third-stage group of the repeater buffer circuits 19's and the additional repeater buffer circuits, and the 4 data lines 200's in this section are parallel with each other. The region between the sections P25 and P26 thus includes the third data-line crossover point. The section P27 is a transmission section ranging from the third-stage group of the repeater buffer circuits 19's and the additional repeater buffer circuits to the fourth data-line crossover point that is between the third-stage group of the repeater buffer circuits 19's and the additional repeater buffer circuits and the fourth-stage group of the repeater buffer circuits 19's and the additional repeater buffer circuits, and the 4 data lines 200's in this section are parallel with each other. The section P28 is a transmission section ranging from the fourth data-line crossover point to the fourth-stage group of the repeater buffer circuits 19's and the additional repeater buffer circuits, and the 4 data lines 200's in this section are parallel with each other. The region between the sections P27 and P28 thus includes the fourth data-line crossover point. The section P29 is a transmission section ranging from the fourth-stage group of the repeater buffer circuits 19's and the additional repeater buffer circuits to the fifth data-line crossover point that is between the fourth-stage group of the repeater buffer circuits 19's and the additional repeater buffer circuits and the serial/parallel conversion circuit 12, and the 4 data lines 200's in this section are parallel with each other. The section P30 is a transmission section ranging from the fifth data-line crossover point to the serial/parallel conversion circuit 12, and the 4 data lines 200's in this section are parallel with each other. The region between the sections P29 and P30 thus includes the fifth data-line crossover point.

As shown in FIG. 19A, when all the read data signals transmitted from the second latch circuit 11b to the serial/parallel conversion circuit 12 via the main data bus MDB are of the same level (same phase), the main data bus MDB involves transmission sections, i.e., the sections P23, P24, P27, and P28, where the signal crosstalks would occur in all the neighboring data lines 200's. In such a case of transmitting read data signals having one same phase, the possible maximum influence of the capacity between adjacent wires among the 4 data lines 200's can be reduced to 30% of that in the case where the inverter-type repeater buffers 202-2's arranged on the respective 4 data lines 200's to constitute one group are aligned along the direction orthogonal to the data lines 200's and the 4 data lines 200's do not cross over one another.

FIG. 19B assumes that the read data signals given to the main data bus MDB are of different levels (reversed phases) for respective data lines 200's. In also this case, the data signal level is not inverted at each repeater buffer 221, but inverted at each inverter-type repeater buffer 202-2, so that the main data bus MDB involves transmission sections, i.e., all the sections P21 to P30, where the neighboring data lines 200's will convey data signals differing in level from each other, and where the signal crosstalks due to the capacity between adjacent wires will occur. Note, however, that the signal crosstalks would occur in all the neighboring data lines 200's in the sections P21 and P30, while the signal crosstalks would occur in only some of the neighboring data lines 200's in the sections P22 to P29. In such a case of transmitting read data signals having reversed phases for the respective bits, the possible maximum influence of the capacity between adjacent wires among the 4 data lines 200's can be reduced to 60% of that in the case where the inverter-type repeater buffers 202-2's arranged on the respective 4 data lines 200's to constitute one group are aligned along the direction orthogonal to the data lines 200's and the 4 data lines 200's do not cross over one another.

The mutual crossover of the data lines 200's may be similarly applied to the staggered-pattern arrangement of the repeater buffer circuits 19's as in the first embodiment, for the similar outcome.

4.3 Effects of Fourth Embodiment

With the foregoing configuration, the fourth embodiment also reduces the difference in extent of the influence of the capacity between adjacent wires, as in the third embodiment. Therefore, variations in degree of deterioration and delay of the transmitted data signals are suppressed; that is, the data lines 200's conveying reversed-phase data signals and the data lines 200's conveying same-phase data signals can deliver their respective data signals to the receiver side with a reduced difference in delay time. The fourth embodiment accordingly allows the serial/parallel conversion circuit 12 to secure a sufficient data capture window and can prevent erroneous read, as in the first embodiment. Semiconductor memory devices with enhanced reliability can thus be achieved.

As a matter of course, the transistor size to adopt in each repeater buffer may be adjusted according to the load on the corresponding line in the same manner as in the first embodiment, so that the same effects as described for the first embodiment can be obtained.

With the embodiments having been described, semiconductor memory devices can be provided with enhanced reliability.

The embodiments are, however, not limited to the specific examples, but tolerate various modifications.

Moreover, the embodiments may be applied to any memory devices, such as a flat NAND flash memory having memory cell transistors two-dimensionally arranged on a semiconductor substrate, a semiconductor memory device including other types of storage configurations, and so on.

Furthermore, expressions such as "connection" and "couple" used herein encompass various forms, including indirect connections between elements where, for example, other components such as transistors, resistors, etc., are provided in the middle of the connections.

While certain embodiments have been described, they have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and the spirit of the inventions.

What is claimed is:
1. A semiconductor memory device comprising:
   a memory cell array comprising a plurality of memory cells;
   a conversion circuit configured to convert parallel data into serial data, and serial data into parallel data;
   a data bus comprising a first data line, a second data line, and a third data line, the data bus configured to transmit data signals between the memory cell array and the conversion circuit concurrently through the first data line, the second data line, and the third data line;
a first buffer and a second buffer on the first data line;
a third buffer and a fourth buffer on the second data line; and
a fifth buffer and a sixth buffer on the third data line,
wherein the first data line extends along a first direction,
the first buffer, the third buffer, and the fifth buffer are aligned along a second direction different from the first direction,
the second buffer, the fourth buffer, and the sixth buffer are aligned along the second direction,
the first to the third data lines include a first region, a second region, and a third region, the second region being between the first region and the third region,
in the first region, the first to third data lines are parallel with one another,
in the third region, the first to third data lines are parallel with one another in an order different from an order of the first to third data lines in the first region, and
in the second region, at least two of the first to the third data lines cross over one another.

2. The device according to claim 1, wherein the first to the sixth buffers are each configured to receive a data signal, invert a logic level of the data signal, and output the data signal.

3. The device according to claim 1, wherein the first buffer, the fourth buffer, and the fifth buffer are each configured to receive a data signal, invert a logic level of the data signal, and output the data signal, and the second buffer, the third buffer, and the sixth buffer are each configured to receive a data signal and output the data signal without inverting a logic level of the data signal.

4. The device according to claim 1, further comprising:
a seventh buffer on the first data line;
an eighth buffer on the second data line; and
a ninth buffer on the third data line,
wherein the seventh buffer comprises a first transistor configured to output a signal to the first data line,
the eighth buffer comprises a second transistor configured to output a signal to the second data line,
the ninth buffer comprises a third transistor configured to output a signal to the third data line, and
the first transistor differs in size from at least one of the second transistor and the third transistor.

5. The device according to claim 4, wherein the memory cell array comprises a first memory cell array for a first plane, and a second memory cell array for a second plane,
the seventh buffer is configured to output a data signal from the first memory cell array to the first data line,
the eighth buffer is configured to output a data signal from the first memory cell array to the second data line,
the ninth buffer is configured to output a data signal from the first memory cell array to the third data line,
the device further comprises a tenth buffer configured to output a data signal from the second memory cell array to the first data line, an eleventh buffer configured to output a data signal from the second memory cell array to the second data line, and a twelfth buffer configured to output a data signal from the second memory cell array to the third data line,
the first data line from the tenth buffer to the conversion circuit is longer than the first data line from the seventh buffer to the conversion circuit,
the second data line from the eleventh buffer to the conversion circuit is longer than the second data line from the eighth buffer to the conversion circuit, and
the third data line from the twelfth buffer to the conversion circuit is longer than the third data line from the ninth buffer to the conversion circuit.

6. The device according to claim 5, wherein the tenth buffer comprises a fourth transistor configured to output a signal to the first data line,
the eleventh buffer comprises a fifth transistor configured to output a signal to the second data line,
the twelfth buffer comprises a sixth transistor configured to output a signal to the third data line, and
the fourth transistor differs in size from at least one of the fifth transistor and the sixth transistor.

7. The device according to claim 4, wherein the first buffer and the second buffer each comprise a fourth transistor configured to output a signal to the first data line,
the third buffer and the fourth buffer each comprise a fifth transistor configured to output a signal to the second data line,
the fifth buffer and the sixth buffer each comprise a sixth transistor configured to output a signal to the third data line, and
the fourth transistor of the first buffer differs in size from at least one of the fourth transistor of the second buffer, the fifth transistor, and the sixth transistor.

8. The device according to claim 1, wherein the first direction is orthogonal to the second direction.

9. The device according to claim 4, wherein the first buffer and the second buffer each comprise a fourth transistor configured to output a signal to the first data line,
the third buffer and the fourth buffer each comprise a fifth transistor configured to output a signal to the second data line,
the fifth buffer and the sixth buffer each comprise a sixth transistor configured to output a signal to the third data line, and
the fourth transistor of the second buffer differs in size from at least one of the fourth transistor of the first buffer, the fifth transistor, and the sixth transistor.

* * * * *